(12) United States Patent
Liu et al.

(10) Patent No.: US 8,840,796 B2
(45) Date of Patent: Sep. 23, 2014

(54) INTEGRATED CIRCUIT METHOD WITH TRIPLE PATTERNING

(71) Applicant: Taiwan Semiconductor Manufacturing Company, Ltd, Hsin-Chu (TW)

(72) Inventors: Chia-Chu Liu, Shin-Chu (TW); Kuei-Shun Chen, Hsin-Chu (TW); Meng-Wei Chen, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/043,371

(22) Filed: Oct. 1, 2013

(65) Prior Publication Data

US 2014/0024218 A1    Jan. 23, 2014

Related U.S. Application Data

(63) Continuation of application No. 13/276,168, filed on Oct. 18, 2011, now Pat. No. 8,562,843.

(51) Int. Cl.
| | | |
|---|---|---|
| *H01B 13/00* | (2006.01) | |
| *H01L 27/02* | (2006.01) | |
| *H01L 21/311* | (2006.01) | |
| *H01L 21/308* | (2006.01) | |

(52) U.S. Cl.
CPC ........ *H01L 21/3086* (2013.01); *H01L 27/0207* (2013.01); *H01L 21/31144* (2013.01)
USPC ................................................ 216/13; 430/5

(58) Field of Classification Search
USPC ................................................ 216/13; 430/5
See application file for complete search history.

(56) References Cited

U.S. PATENT DOCUMENTS 7,385,676 B2 *    6/2008   Rotsch ........................... 355/67
7,648,918 B2      1/2010   Liu et al.

* cited by examiner

*Primary Examiner* — Roberts Culbert
(74) *Attorney, Agent, or Firm* — Haynes and Boone, LLP

(57) ABSTRACT

The present disclosure provides one embodiment of an integrated circuit (IC) design method. The method includes receiving an IC design layout having a plurality of IC features. The method includes identifying, from the IC design layout, simple features as a first layout wherein the first layout does not violate design rules; and complex features as a second layout wherein the second layout violates the design rules. The method further includes generating a third layout and a fourth layout from the second layout wherein the third layout includes the complex features and connecting features to meet the design rules and the fourth layout includes trimming features.

19 Claims, 27 Drawing Sheets

INTEGRATED CIRCUIT METHOD WITH TRIPLE PATTERNING

This application is a continuation of U.S. Ser. No. 13/276,168 filed Oct. 18, 2011, the entire disclosure of which is hereby incorporated by reference.

BACKGROUND

Semiconductor technologies are continually progressing to smaller feature sizes, for example down to feature sizes of 28 nanometers, 20 nanometers, and below. A patterned photoresist (PR) layer used to produce such small feature sizes typically has a high aspect ratio. Maintaining a desired critical dimension (CD) can be very difficult for various reasons, including incapability of shrinking the minimum area, degraded trench end resolution and sharp trench end shape being not fit the metal fill process.

Therefore, what is needed is a method and a photomask structure to provide effective IC design and fabrication for the advanced IC technologies addressing the above problems.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

Figure 1:
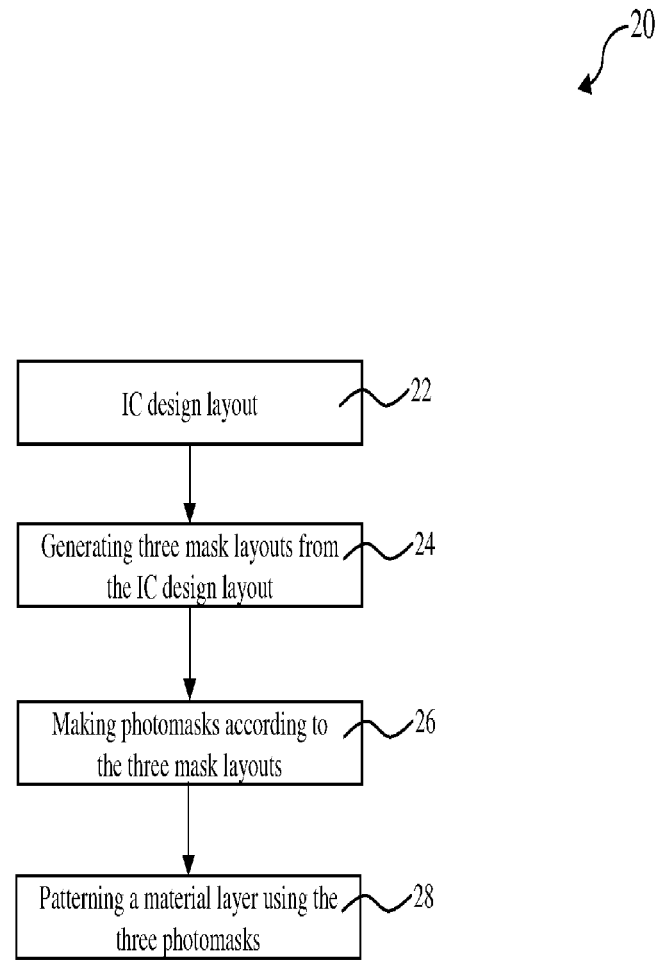
FIG. 1 is a flowchart of an embodiment of an integrated circuit (IC) method constructed according to aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 20 for making integrated circuit (IC) constructed according to various aspects of the present disclosure in one or more embodiments. The method 20 begins at step 22 by providing or receiving an IC design layout (or IC design pattern), such as from a designer. In one example, the designer can be a design house. In another example, the designer is a design team separated from a semiconductor manufacturer assigned for making IC products according to the IC design layout. In various embodiments, the semiconductor manufacturer is capable for making photomasks, semiconductor wafers, or both. The IC design layout includes various geometrical patterns designed for an IC product and based on the specification of the IC product.

The method 20 proceeds to step 24 by generating three mask layouts (mask patterns) from the IC design layout. The three mask layouts are to be formed on three photomasks (mask or reticle), respectively. Particularly, the step 24 includes two sub-steps. At the first sub-step, the circuit features are split into two groups: a set of simple features and a set of complex features based on the design rules. At the second sub-step, the set of complex features are modified by merging (or adding connecting features) to meet the design rules. A trimming layout is generated accordingly. The trimming layout includes a plurality of trimming features corresponding to the connecting features. Thus, the set of simple features represent a first mask layout. The set of complex features modified represent a second mask layout. The trimming layout is a third mask layout.

The method 20 proceeds to step 26 by making three photomasks according to the three mask layouts, respectively. In one embodiment, an e-beam or a mechanism of multiple e-beams is used to form a pattern on a photomask based on a mask layout.

The method 20 proceeds to step 28 by patterning a material layer using the three photomasks. The plurality of circuit features in the IC design layout are formed in the material layer on a substrate. Particularly, the patterning of the material layer includes lithography processes and etching processes. In the present embodiment, the step 28 includes forming a first patterned photoresist layer on the material layer using the first photomask by a lithography process including coating, exposure and developing. Then, an etching process is applied to the material layer through the openings of the first patterned photoresist layer. Thereafter, the first patterned photoresist layer is removed. A second photoresist layer is coated on the material layer; is exposed using the second and third photomasks simultaneously or sequentially; and is developed to form the second patterned photoresist layer. The material layer is etched through the openings of the second patterned photoresist layer. The second patterned photoresist layer is removed afterward.

Other process steps may be implemented before, during and after the steps in the method 20. For example, the material layer is a hard mask layer. The substrate or an underlying material is etched using the hard mask layer as an etch mask, such that the IC features formed on the hard mask layer is transferred to the substrate or the underlying material layer.

Figure 2:
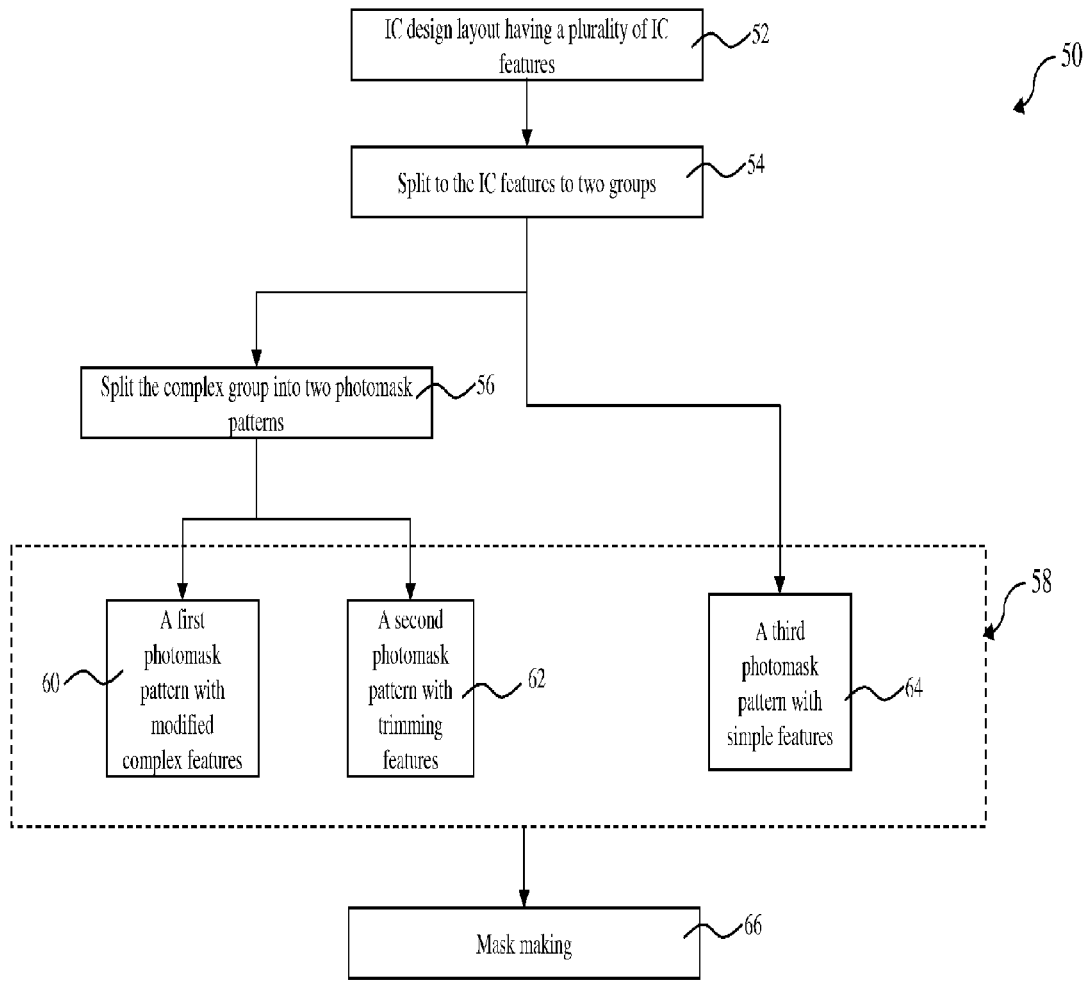
FIG. 2 is a flowchart of another embodiment of an IC method constructed according to aspects of the present disclosure.

FIG. 2 is a flowchart of a method 50 for integrated circuit (IC) designing and mask making constructed according to various aspects of the present disclosure in one or more embodiments. The method 50 is one embodiment of the step 24 (and step 26) in FIG. 1. FIGS. 3-8 are schematic views of various layout at different design stages and constructed according to aspects of the present disclosure. The method 50 is described with reference to FIGS. 2 through 8.

Figure 3:
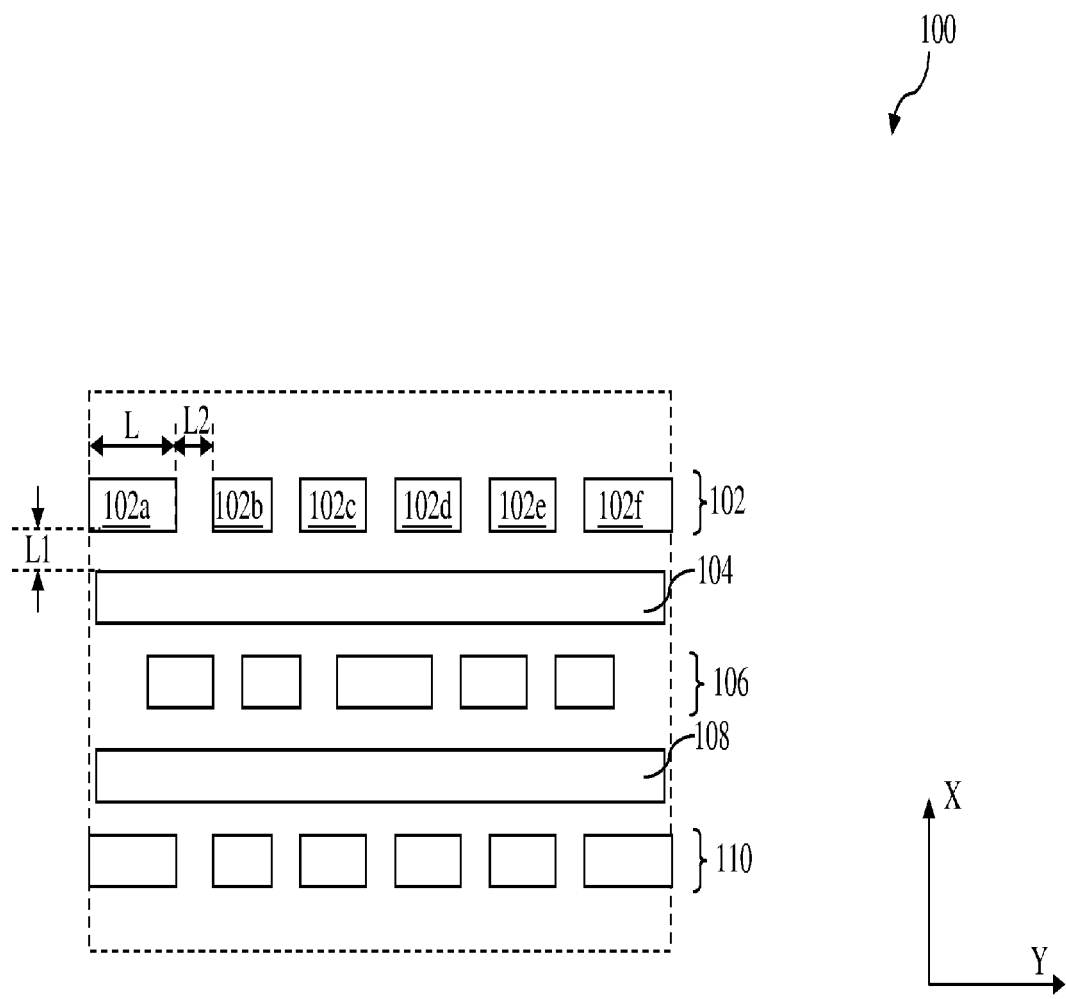
FIGS. 3-8 are schematic views of an IC design layout at various design stages and constructed according to aspects of the present disclosure.
Figure 4:
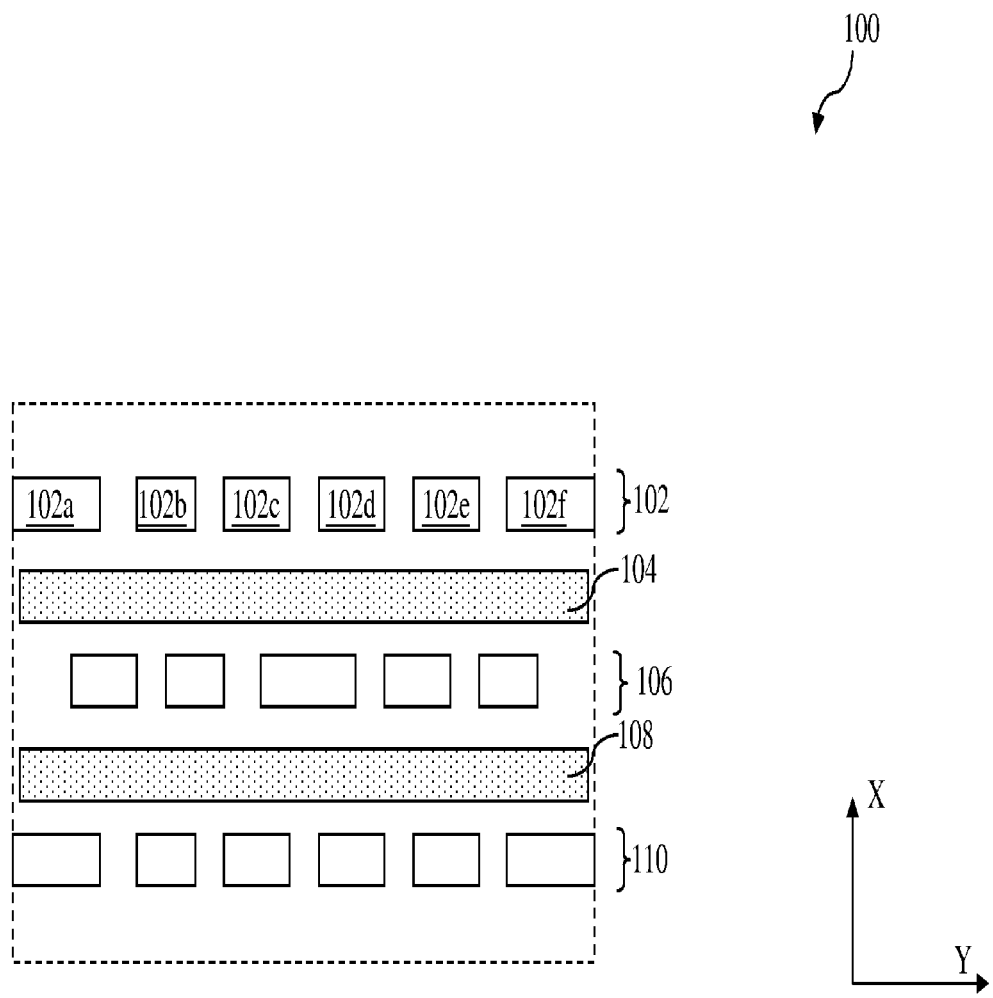

The method begins at step 52 by providing or receiving an IC design layout, such as from a designer. The IC design layout includes various geometrical patterns (IC features or circuit features) designed for an IC product and based on the specification of the IC product. FIG. 3 illustrates one exemplary IC design layout 100 having various IC features 102, 104, 106, 108 and 110. In a particular example, The IC features 102 further includes IC features 102a through 102f.

The IC design layout is presented in one or more data files having the information of the geometrical patterns. In one example, the IC design layout is expressed in a "gds" format known in the art. The designer, based on the specification of the product to be manufactured, implements a proper design procedure to carry out the IC design layout. The design procedure may include logic design, physical design, and/or place and route. As an example, the IC design layout includes various IC features, such as active region, gate electrode, source and drain, metal lines or via of the interlayer interconnection, and openings for bonding pads, to be formed in a semiconductor substrate (such as a silicon wafer) and various material layers disposed over the semiconductor substrate. The IC design layout may include certain assist features, such as those features for imaging effect, processing enhancement, and/or mask identification information. In the present embodiment, the IC design layout includes a plurality of circuit features to be formed in a material layer on a substrate, such as a silicon wafer. In one example, the plurality of circuit features are metal lines formed in a metal layer.

The method 50 proceeds to step 54 by splitting the IC design layout into two groups: a first group of simple features and a second group of complex features.

The IC design layout needs to meet various design rules so that the circuit features in the IC design layout can be properly fabricated on a semiconductor substrate, such as a silicon wafer. The design rules include one or more feature design rules that define geometrical dimensions of a circuit feature. In one example, a feature design rule requires that a circuit feature has a length L equal to or greater than a minimum length $L_m$, formulated as $L>=L_m$. The design rules also include one or more relational design rules that define spatial relationship between two approximate circuit features. In one example, a relational design rule requires two circuit features have a distance S (or spacing) equal to or greater than a minimum distance $S_m$, formulated as $S>=S_m$. FIG. 3 illustrates the IC feature 102a has a length L, a first spacing L1 to the IC feature 104 and a second spacing L2 to the 102b.

The IC design layout is processed to identify a first group (or a first layout) of simple features and a second group (a second layout) of complex features according to the design rules. In the first layout, the simple features do not violate any design rules. Specifically, each simple feature does not violate the feature design rules. Any two simple features in the first layout do not violate any relational design rules. In the second layout, the complex features violate at least a subset of the design rules. For example, a complex feature may violate the feature design rules, such as its length being less than the minimum length. In another example, two complex features in the second layout may violate a relational design rules, such as the spacing between the two complex features being less than the minimum spacing.

At step 54, splitting the IC features in the IC design layout into the first and second layouts eliminates a number of violations to the design rules and further limits the rest violations only in the second layout.

In one embodiment, if an IC feature does not violate a feature design rule, it is identified as a simple feature. If an IC feature violates a feature design rule, it is identified as a complex feature. For example, if an IC feature has a length less than the minimum length, it is identified as a complex feature.

In another example, such as the IC design layout 100 illustrated in FIG. 3, the IC features are various line features oriented in Y direction. The IC features are split such that the violations to the relational design ruler associated with the spacing in the X direction are eliminated. The IC features with violations to the relational design rules associated with the spacing in the Y direction and with violations to the feature design rules are grouped to the second layout. The IC features without violations to the relational design rules associated with the spacing in the Y direction and without violations to the feature design rules are grouped to the first layout, such as those illustrated in FIG. 4. After the splitting at step 54, the IC design layout 100 is split into the first layout 112 illustrated in FIG. 5 and the second layout 114 illustrated in FIG. 6. The spacing issues in the X direction are solved for both the first layout 112 and the second layout 114.

Figure 6:
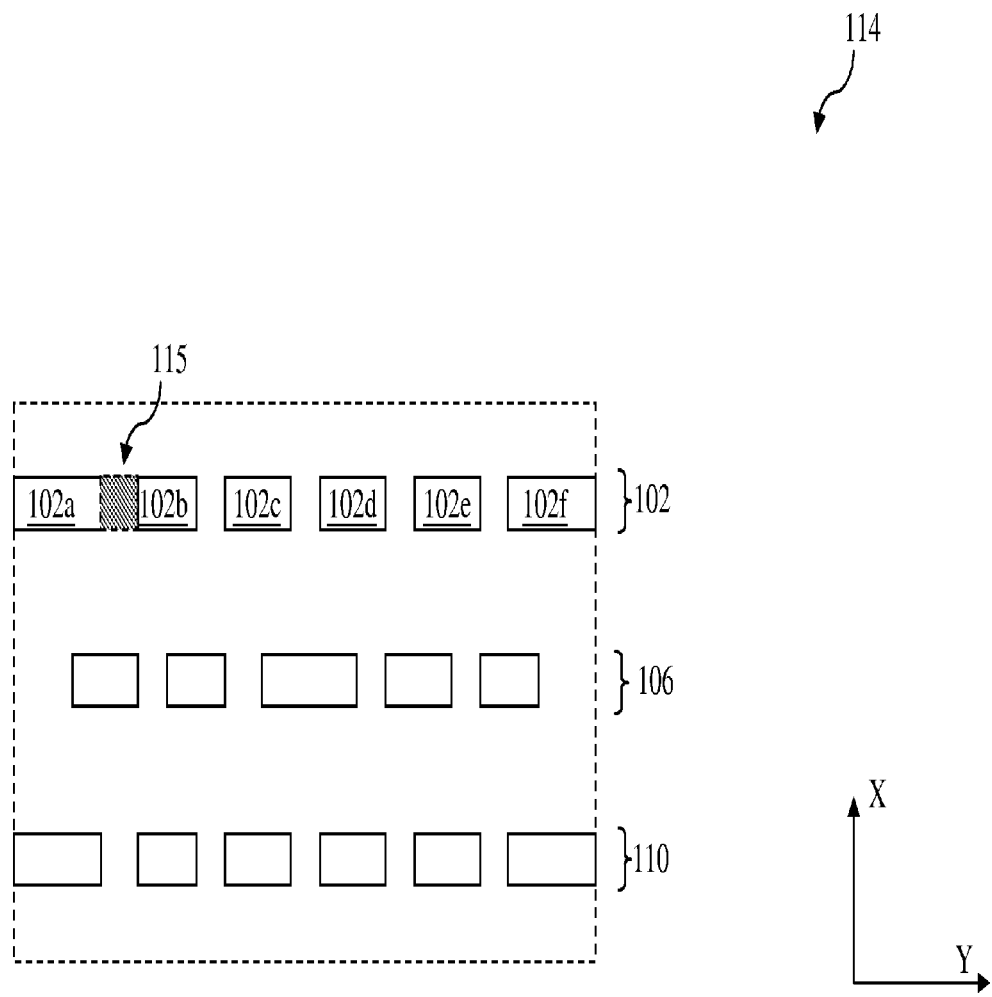

Referring back to FIG. 3, the method 50 includes a step 56 to further split the second layout of complex features into two layout: a third layout and a fourth layout, to eliminate the violations of the design rules in the second layout. The third layout is generated by merging (connecting) the IC features in the second layout. Stating differently, various connecting features are added to the IC features in the second layout to connect adjacent IC features, reduce the number of IC features and avoid the violation of the design rules. A connecting feature 115 is shown in FIG. 6 for illustration.

In one embodiment, a short IC feature (e.g., L<Lm) is connected to another IC feature such that the corresponding feature design rule (e.g., L>=Lm) is not violated. In another embodiment, two close IC features (S<Sm) are connected together such that the corresponding relational design rule (S>=Sm) is not violated.

Figure 7:
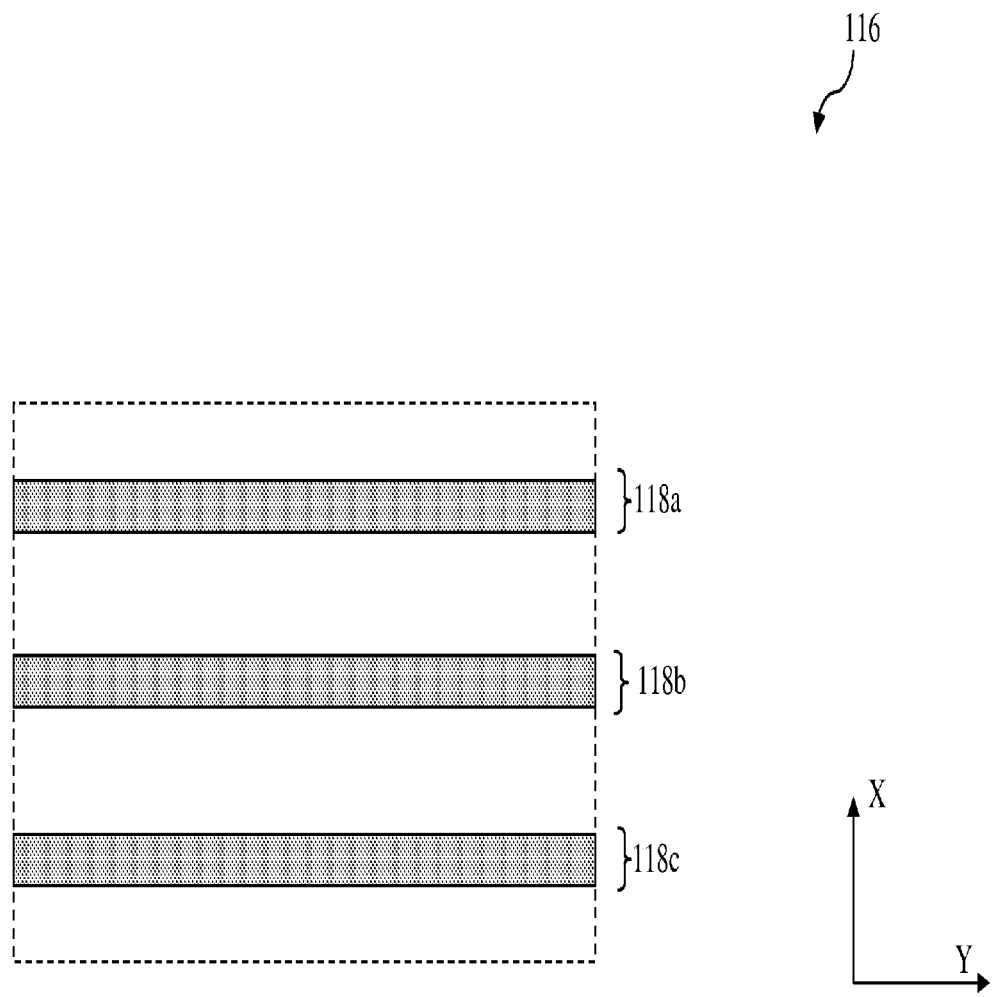

In another embodiment, such as the IC design layout 100, the corresponding second layout 114 eliminates the violation of the relational design rules associated with the spacing in the X direction after the first splitting. The violation of the relational design rules associated with the spacing in the Y direction in the second layout 114 is eliminated by adding connecting features. Similarly, by adding the connecting features, the short IC features are connected (merged) to long IC features such that the violation of the feature design rules is eliminated. By adding the connecting features, a third layout 116 is generated, as illustrated in FIG. 7. The third layout includes complex features and connecting features, collectively referred to as modified complex features. In the present embodiment, the third layout 116 include modified complex features 118a, 118b and 118c.

The fourth layout includes trimming features and is generated according to the connecting features added in the third layout. The trimming features in the fourth layout are designed to exclude the connecting features during an exposing process of the photolithography. The trimming features in the fourth layout correspond to the connecting features in the third layout. For example, a trimming feature is generated in the fourth layout accordingly for each connecting feature in the third layout. In another example, a trimming feature is generated in the fourth layout accordingly for more than one connecting feature in the third layout.

Figure 8:
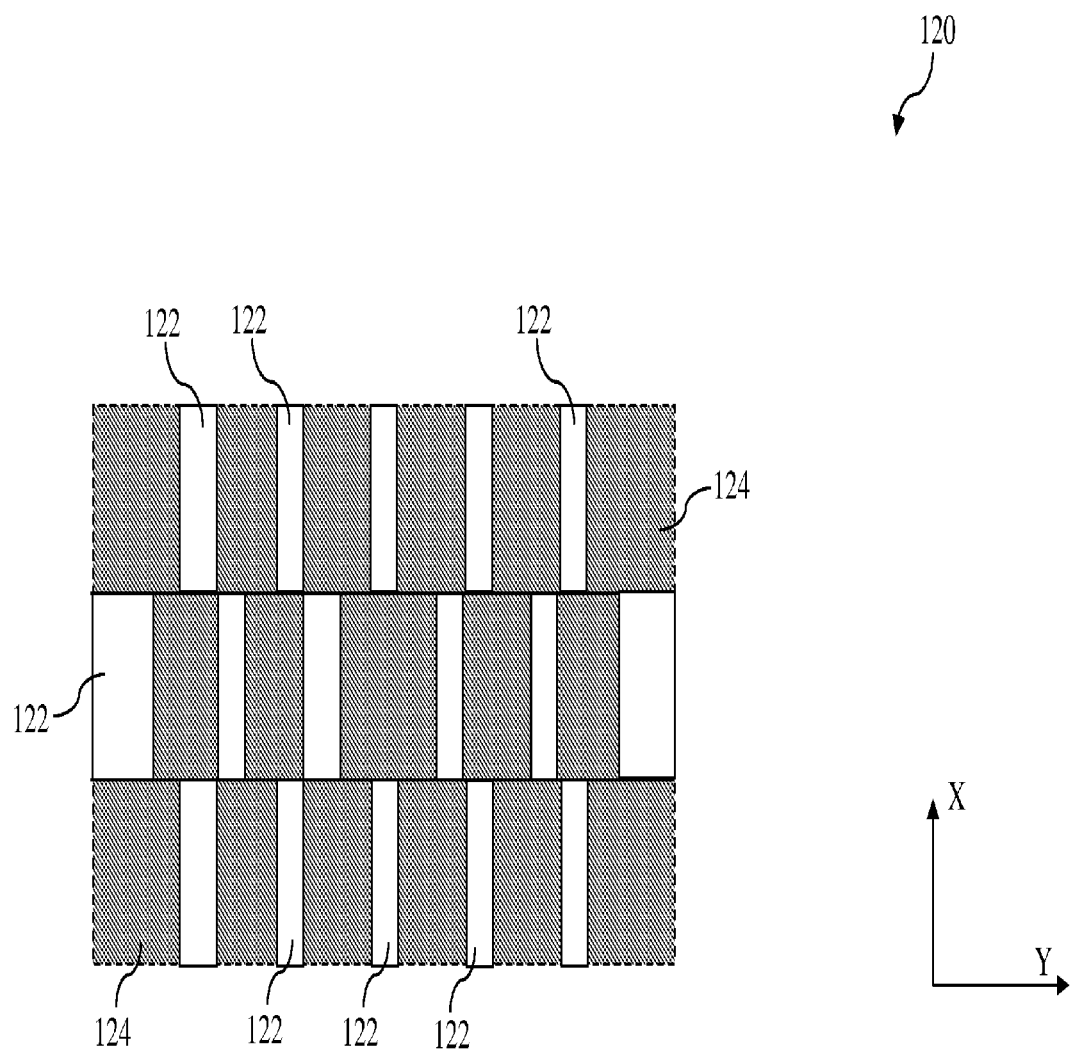

In the present embodiment, such as the third layout 116 illustrated in FIG. 7, the fourth layout 120 is generated in FIG. 8. The fourth layout 120 includes a plurality of trimming features 122 separated by the opaque regions 124.

Referring back to FIG. 3, three mask patterns are generated for making three corresponding photomasks (masks), as illustrated in block 58. Particularly, as shown in block 60, a first mask pattern is the third layout of modified complex features (complex features and connecting features), such as the third layout 116 in FIG. 7. As shown in block 62, a second mask pattern is the fourth layout of trimming features, such as the fourth layout 120 in FIG. 8. As shown in block 62, a third mask pattern is the first layout of simple features, such as the first layout 112 in FIG. 5.

The method 50 may further include a step 66 by making a set of photomasks used during making the IC features of the IC design layout 100 to a material layer in a semiconductor substrate. The set of photomasks includes the first, second and third photomasks having the first, second and third mask patterns, respectively.

In one embodiment, an e-beam or a mechanism of multiple e-beams is used to form a pattern on a photomask based on a mask layout. The photomask can be formed in various technologies. In one embodiment, the photomask is formed using the binary technology. In this case, the mask pattern includes opaque regions and transparent regions. The radiation beam (e.g. ultraviolet or UV beam), used to expose the image sensitive material layer (such as photoresist) coated on a wafer, is blocked by the opaque region and transmits through the transparent regions. In one example, the binary photomask includes a transparent substrate (e.g., fused quartz), and an opaque material (e.g., chromium) coated in the opaque regions of the mask. In another embodiment, one or a subset of the photomasks is formed using a phase shift technology. In the phase shift mask (PSM), various features in the pattern formed on the mask are configured to have proper phase difference to enhance the resolution and imaging quality. In various examples, the PSM can be an attenuated PSM or an alternating PSM known in the art.

Various advantages or benefits may present in different embodiment of the present disclosure. For example, by implementing the method 50, the second layout of complex features may follow loose design rules such that some of the design rules are not satisfied. Then the layout of complex features is further split to generate two photomasks that meet the design rules. Thus, the two photomasks may not be capable of generating various IC features in two layouts without violating the design rules. The disclosed method uses three photomasks to define an IC design layout without violating the design rules. In another example, the first split eliminates the violation of the design rules associated with the minimum spacing in a first direction. The second split eliminates the violation of the design rules associated with the minimum spacing in a second direction perpendicular the first direction. The critical area issues are solved by the two splits. Furthermore, the short line features are connected to long line features in the second split. Thus, the line end issues are solved. In another example, the disclosed method effectively generates three photomasks defining an IC design layout and are used to make various IC features of the IC design layout into one material layer on an IC substrate. One photomask includes a layout of simple features. Another photomask includes a layout of modified complex features and the third photomask includes a layout of trimming features. The three photomasks collectively define the IC design layout in a method having two procedures of lithography process and etch process.

Figure 9:
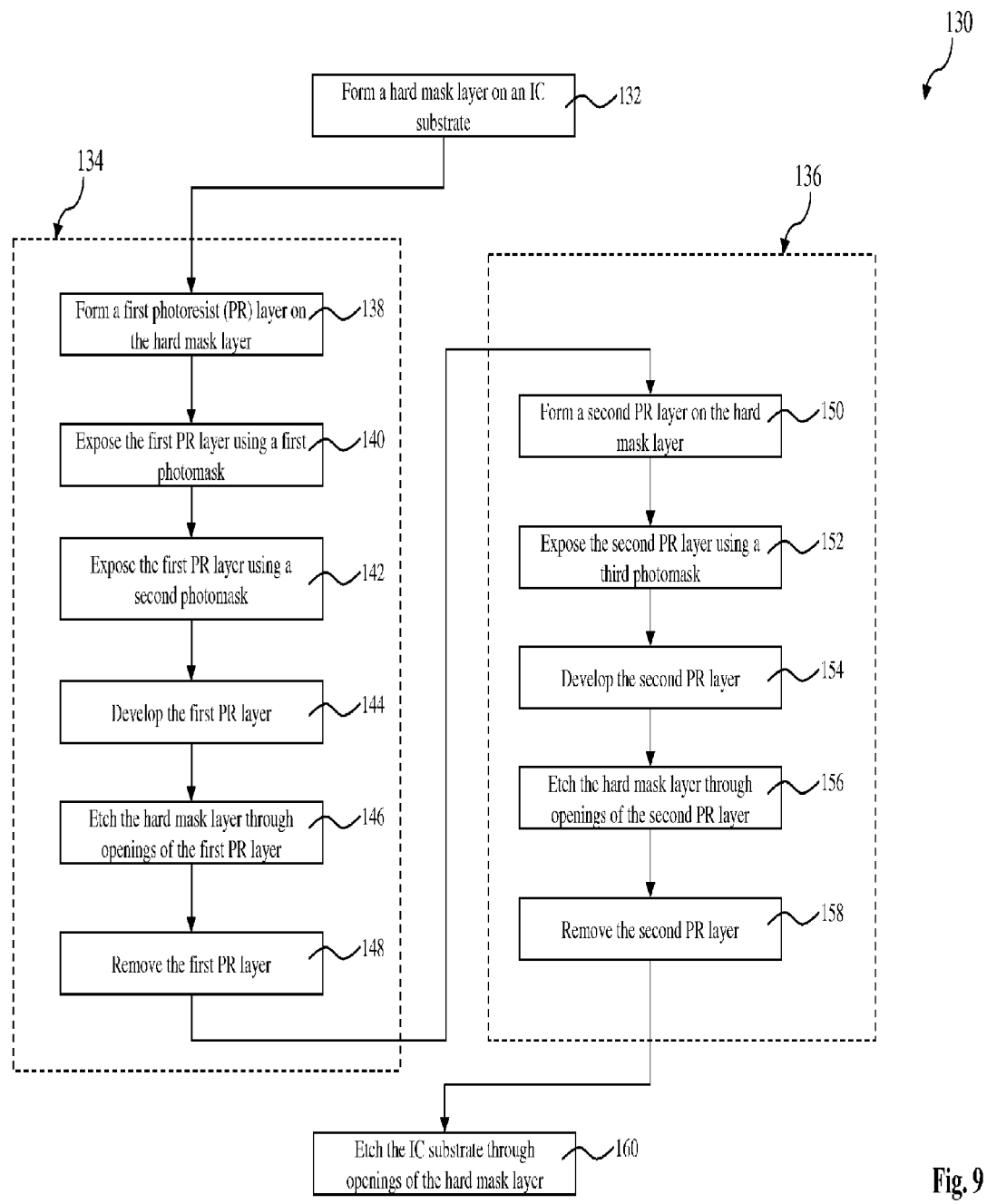
FIG. 9 is a flowchart of an embodiment of an IC method constructed according to aspects of the present disclosure.

FIG. 9 is a flowchart of a method 130 for making an IC pattern using the three photomasks according to the present disclosure in one or more embodiments. In one example, the method 130 is an embodiment of the step 28 of the method 20 in FIG. 1. FIGS. 10, 14-17, 20-22 and 24 are sectional views of an IC structure 170 constructed according to aspects of the present disclosure. FIGS. 11-13, 18-19 and 23 are fragmental top views of the IC structure 170 at various design stages and constructed according to aspects of the present disclosure. With references to FIGS. 9-24, the method 130 and the semiconductor structure 170 are collectively described below.

Figure 10:
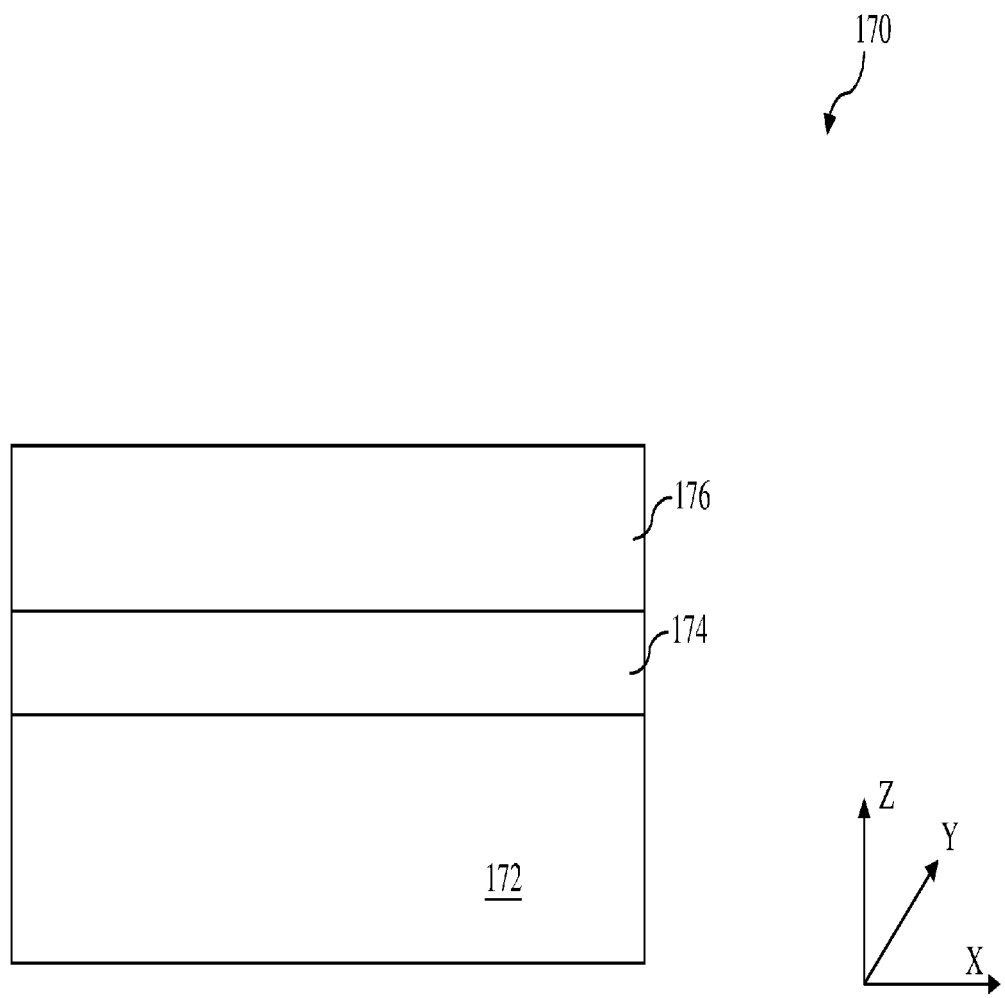
FIGS. 10, 14-17, 20-22 and 24 are sectional views of an IC structure constructed according to aspects of the present disclosure.

Referring to FIGS. 9 and 10, the method 130 begins at step 132 by forming a hard mask layer on a substrate. The semiconductor structure 170 includes an IC substrate 172, such as a silicon wafer or a semiconductor substrate of other materials or a substrate having a semiconductor material layer formed thereon. The IC substrate 172 may additionally or alternatively include germanium, silicon germanium, gallium arsenic, or other proper semiconductor materials. The substrate 172 may include various doped regions, dielectric features, and/or a portion of multilevel interconnects. In one embodiment, the IC substrate 172 includes various doped features for various microelectronic components, such as a complementary metal-oxide-semiconductor field-effect transistor (CMOSFET), an imaging sensor, a memory cell, and/or a capacitive element. In another embodiment, the substrate 172 includes conductive material features and dielectric material features configured for coupling and isolating various microelectronic components, respectively. In another embodiment, the substrate 172 include one or more material layers formed thereon. The substrate is defined in two orthogonal directions X and Y. A third direction Z is perpendicular to the substrate 172 (or perpendicular to the X and Y directions).

The semiconductor structure 170 may further include a material layer (not shown) formed on the substrate 172. The material layer is to be patterned to form various circuit features, such as metal lines, contacts/via features. In the present embodiment for illustration, the material layer is a dielectric material layer, such as interlayer dielectric (ILD) layer, to be patterned to form various metal lines.

A hard mask layer 174 is formed on the substrate 172. The hard mask layer 174 includes a suitable material used for patterning, such as silicon oxide, silicon nitride, silicon oxynitride, silicon carbide or other proper material. The hard mask layer may be deposited by chemical vapor deposition (CVD) or other suitable technology with proper thickness.

The method 130 includes patterning the hard mask layer by a first procedure in block 134 and by a second procedure in block 136. The first procedure 134 includes a lithography process using two photomasks and an etching process. The second procedure 136 includes a lithography process using one photomask and an etching process. The three photomasks define various circuit features defined in one layer. The definition and generation of the three photomasks are described in the method 50.

Still referring to FIGS. 9 and 10, the method 130 proceeds to step 138 by forming a first photoresist (PR) layer 176 on the hard mask layer 174. In one embodiment, the formation of the first PR layer 176 includes coating (such as spin-on coating) and may further include baking to reduce the solvent in the PR layer 176.

Figure 11:
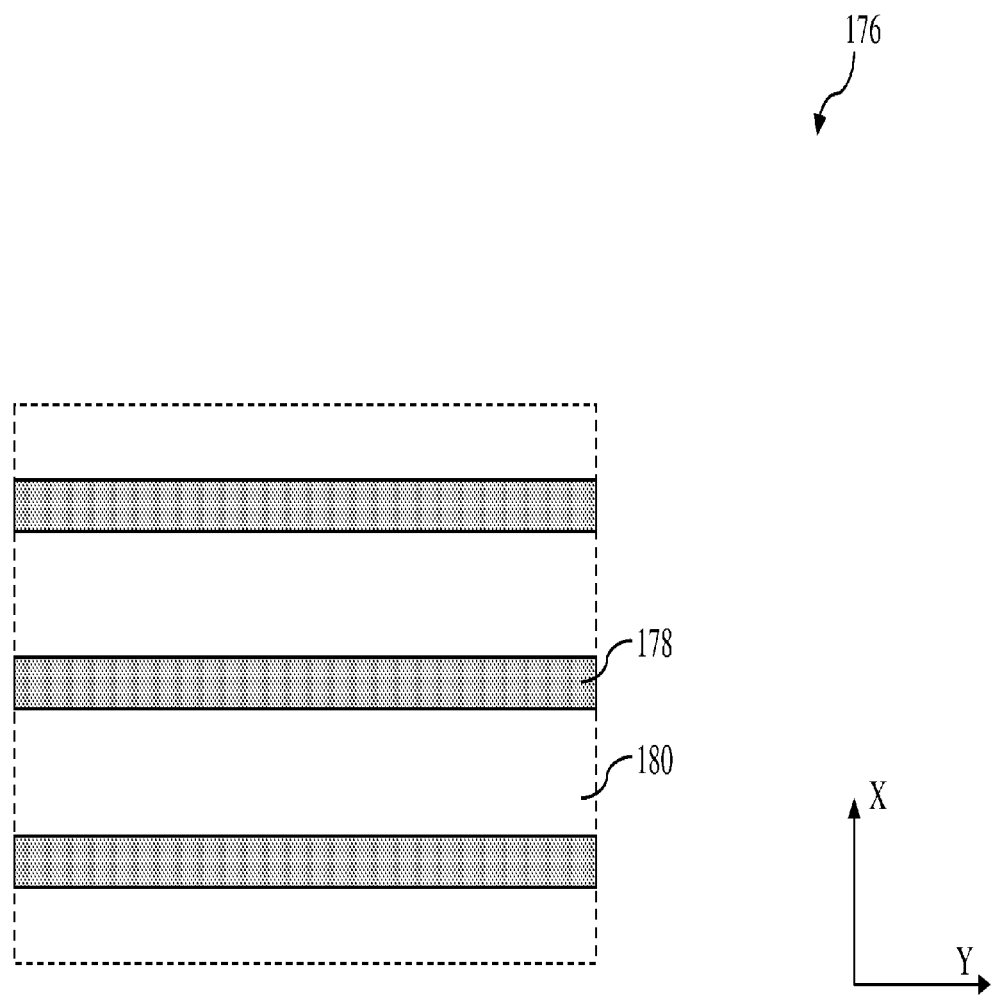
FIGS. 11-13, 18-19 and 23 are fragmental top views of an IC structure at various design stages and constructed according to aspects of the present disclosure.

Referring to FIGS. 9 and 11, the method 130 proceeds to step 140 by exposing the first PR layer 176 using a first photomask, such as the first photomask 116 of FIG. 7 of modified complex features including the complex features and the connecting features. The exposed PR layer 176 is illustrated in FIG. 11 as a top view. The exposed PR layer 176 includes unexposed regions 178 and exposed regions 180.

Figure 12:
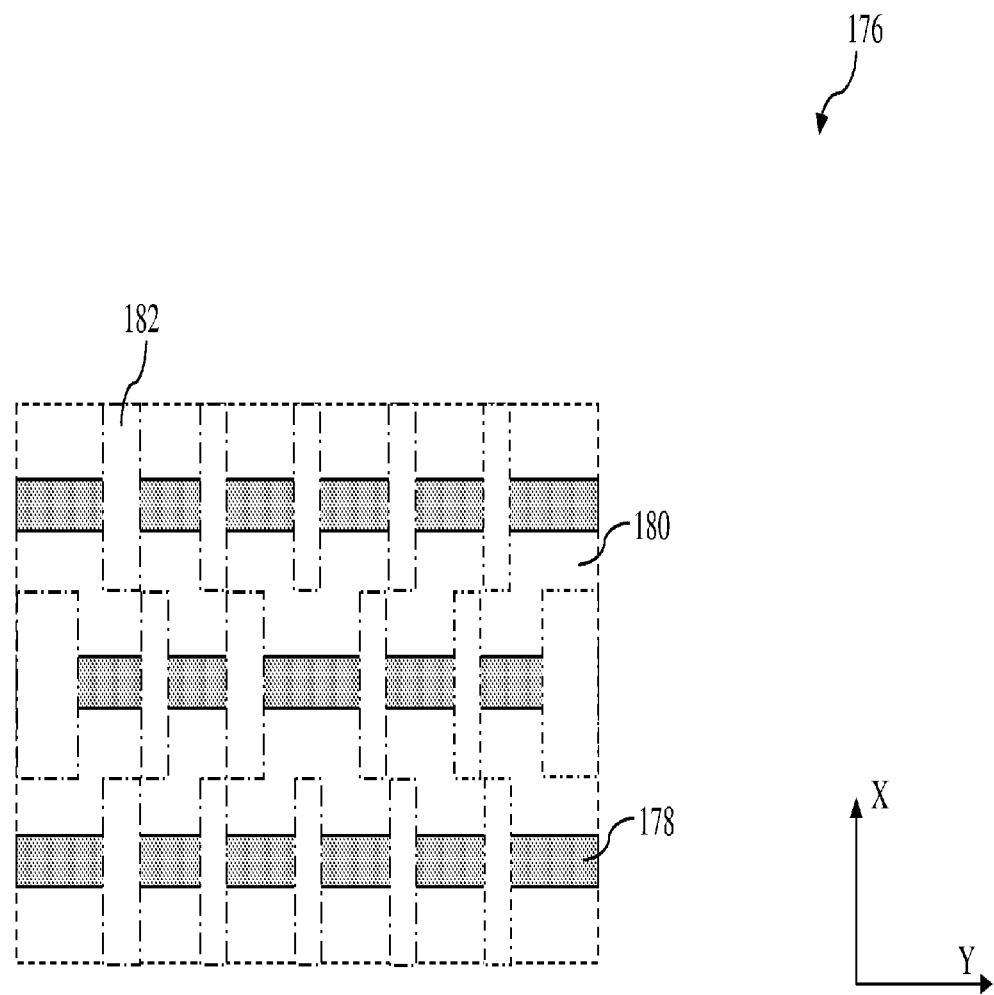

Referring to FIGS. 9 and 12, the method 130 proceeds to step 142 by exposing the first PR layer 176 using a second photomask, such as the second photomask 120 of FIG. 8 of trimming features. The exposed PR layer 176 is illustrated in FIG. 12 as a top view. The exposed PR layer 176 includes the first exposed regions 180 and the second exposed regions 182.

In the present embodiment, the first exposure and the second exposure are sequentially implemented in the described order or alternatively in a different order. In another embodiment, the first and second exposure are combined into one exposing process such that the first PR layer 176 is exposed simultaneously by the first photomask and the second photomask, resulting in the exposed PR layer 176 as illustrated in FIG. 12. In this case, the photolithography apparatus is design designed to hold two photomasks at the same time. The light beam is split to two beams that one beam is directed through the first photomask and the another beam is directed through the second photomask. The two beams from the first and second photomasks are further directed to the PR layer 176. Thus, the exposed PR pattern is a combined pattern from the first and second photomasks.

Figure 13:
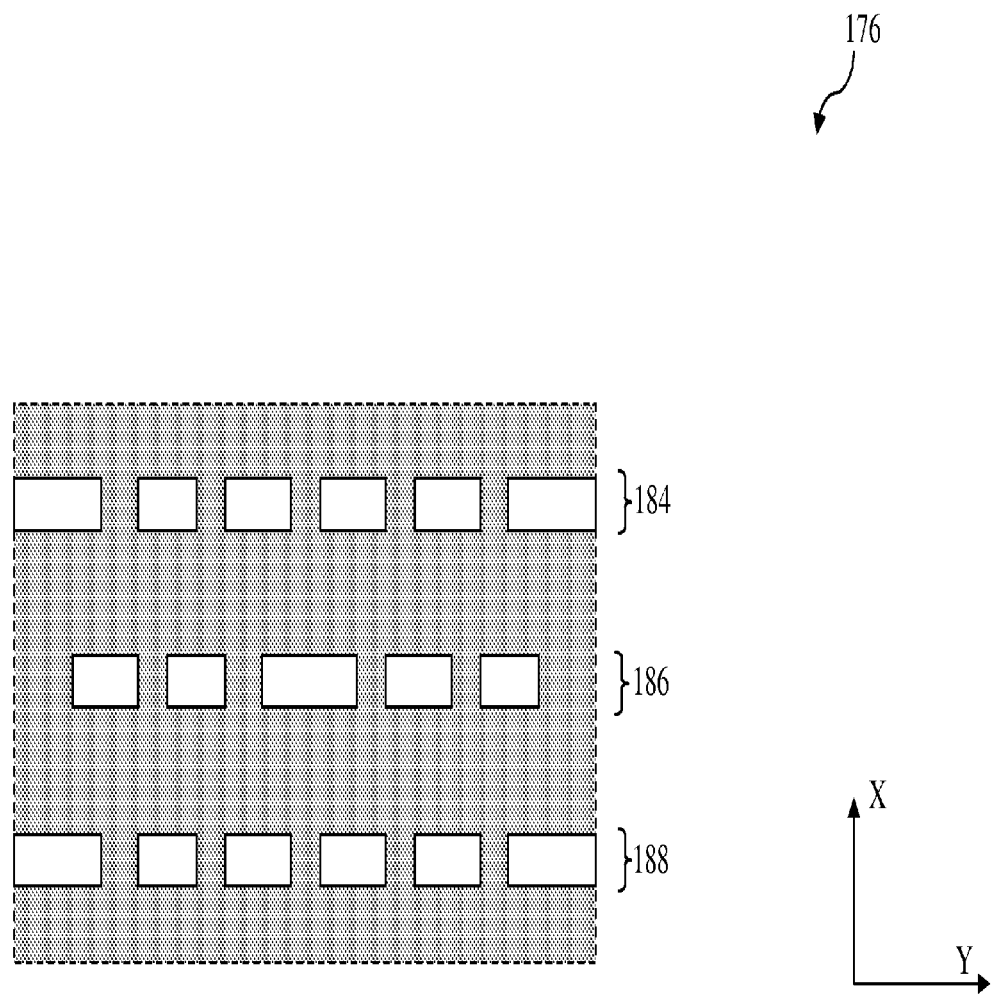
Figure 14:
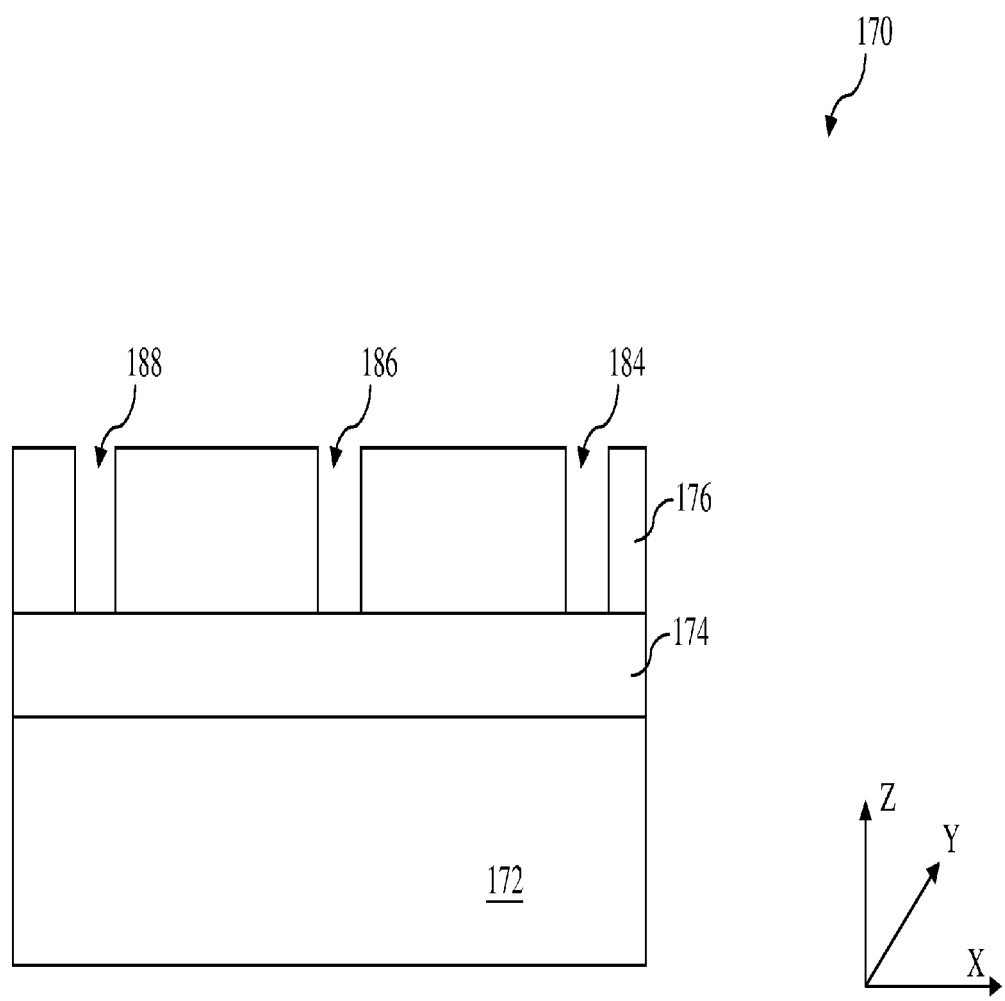

Referring to FIGS. 9, 13 and 14, the method 130 proceeds to step 144 by developing the PR layer 176, forming the patterned PR layer 176 having a plurality of openings 184, 186 and 188. FIG. 13 illustrates the patterned PR layer 176 in a top view. In the present embodiment, a negative developing solution is used such that the PR in the unexposed regions are removed, resulting in a negative image of the exposed pattern.

Figure 15:
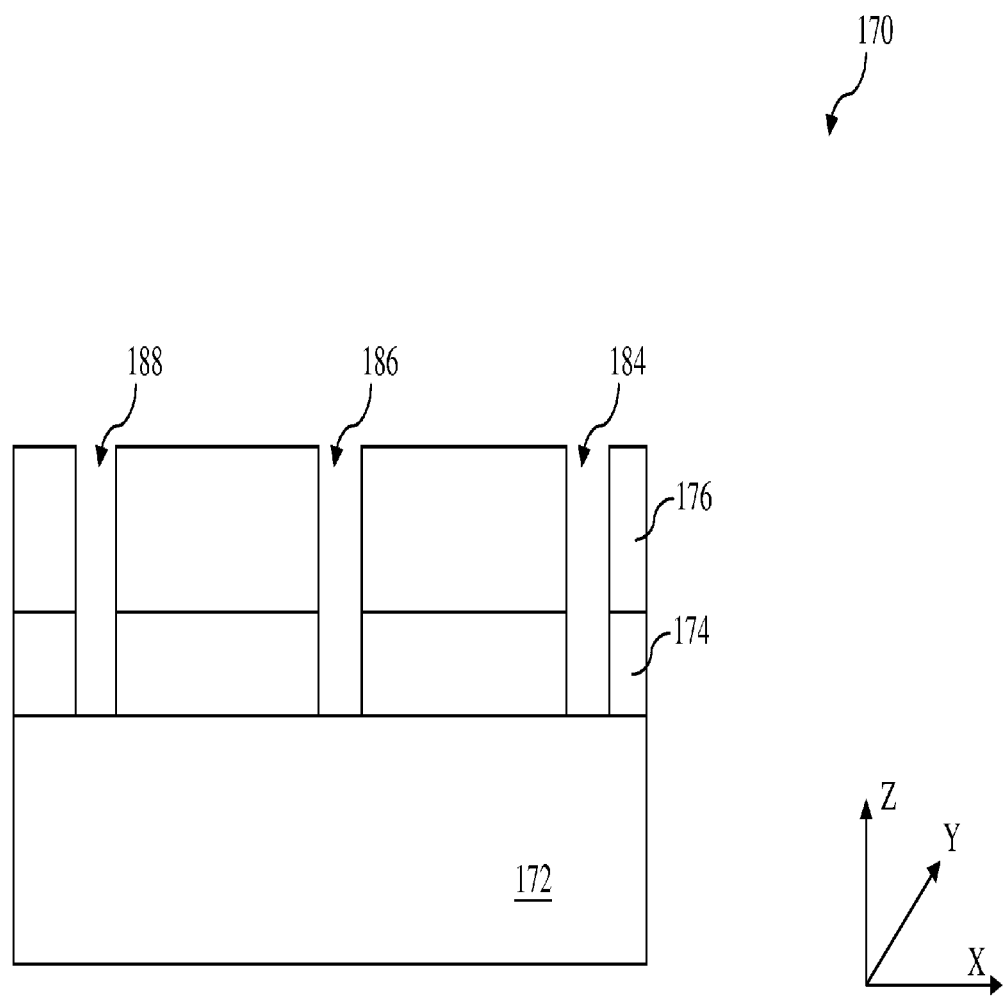

Referring to FIGS. 9 and 15, the method 130 proceeds to step 146 by etching the hard mask layer 174 through the openings of the PR layer 176. The etching process uses the patterned first PR layer as an etch mask. The etching process may include dry etch, wet etch, a combination thereof or other suitable etch technology.

Figure 16:
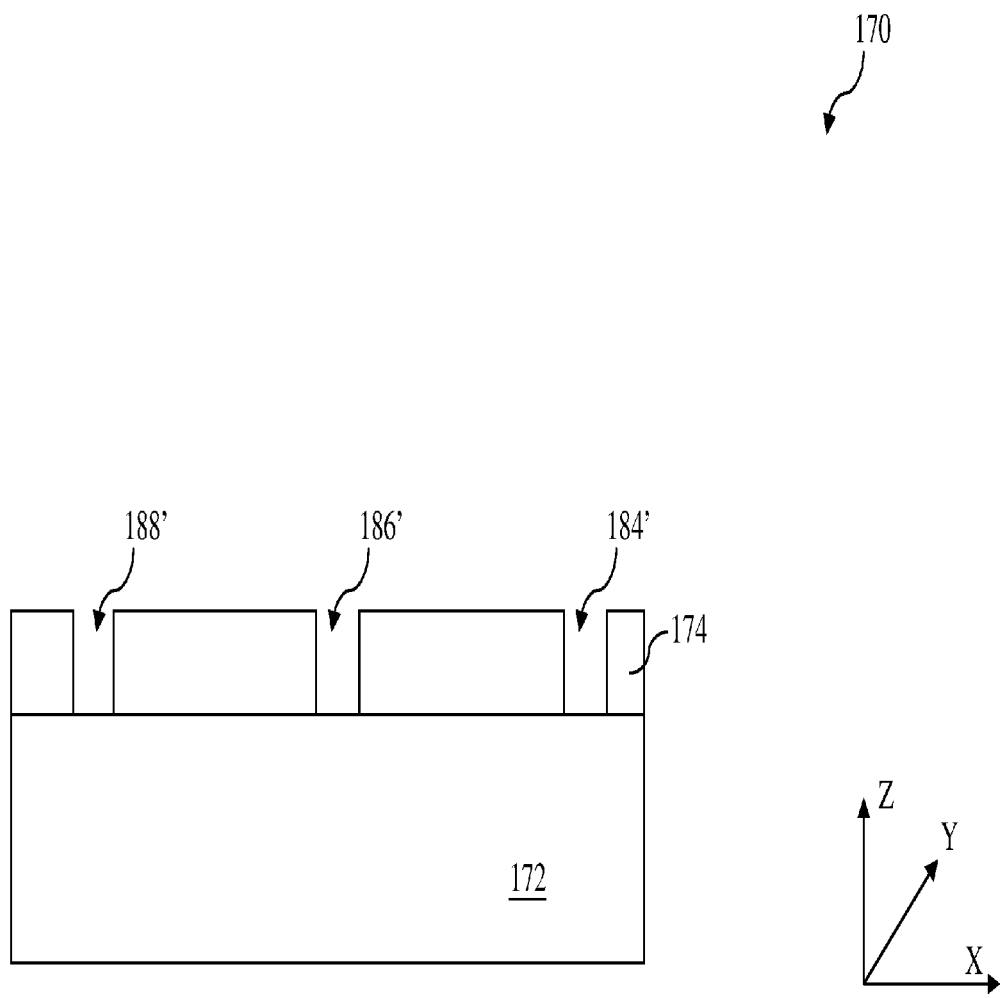

Referring to FIGS. 9 and 16, the method 130 may proceed to step 148 by removing the first PR layer 176 thereafter, by wet stripping or plasma ashing. In the present embodiment, the patterned hard mask layer 174 includes openings 184', 186' and 188', as illustrated in FIG. 16.

Figure 17:
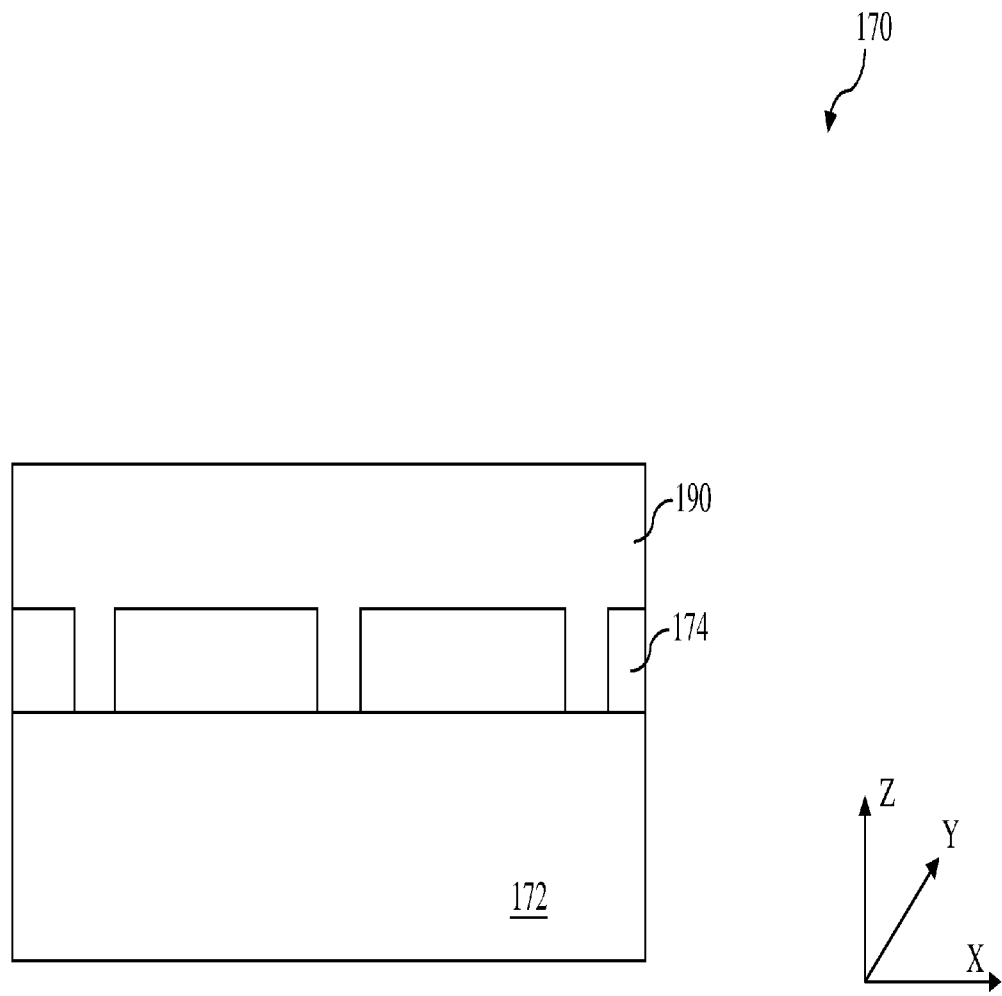

Referring to FIGS. 9 and 17, the method 130 proceeds to step 150 by forming a second PR layer 190 on the hard mask layer 174. In one embodiment, the formation of the first PR layer 190 includes coating and baking. The second PR layer 190 may further fill the openings of the hard mask layer 174.

Figure 5:
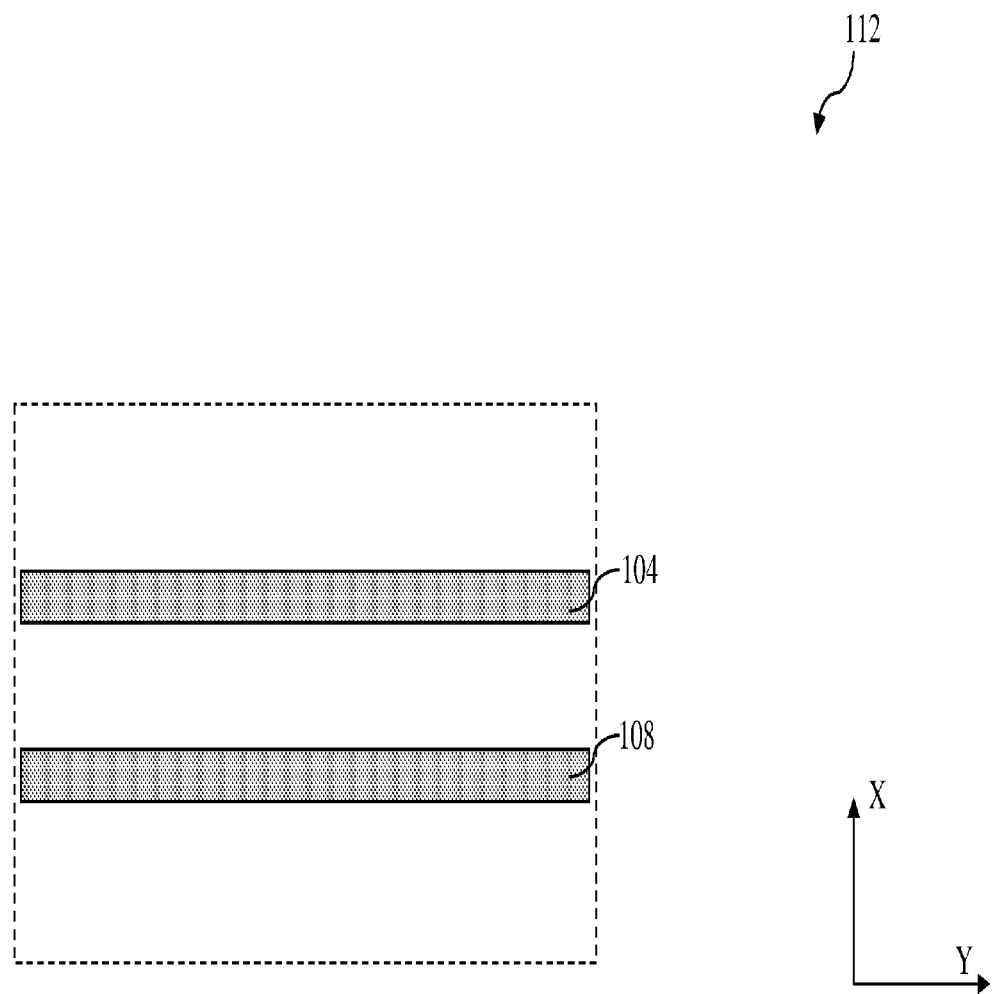
Figure 18:
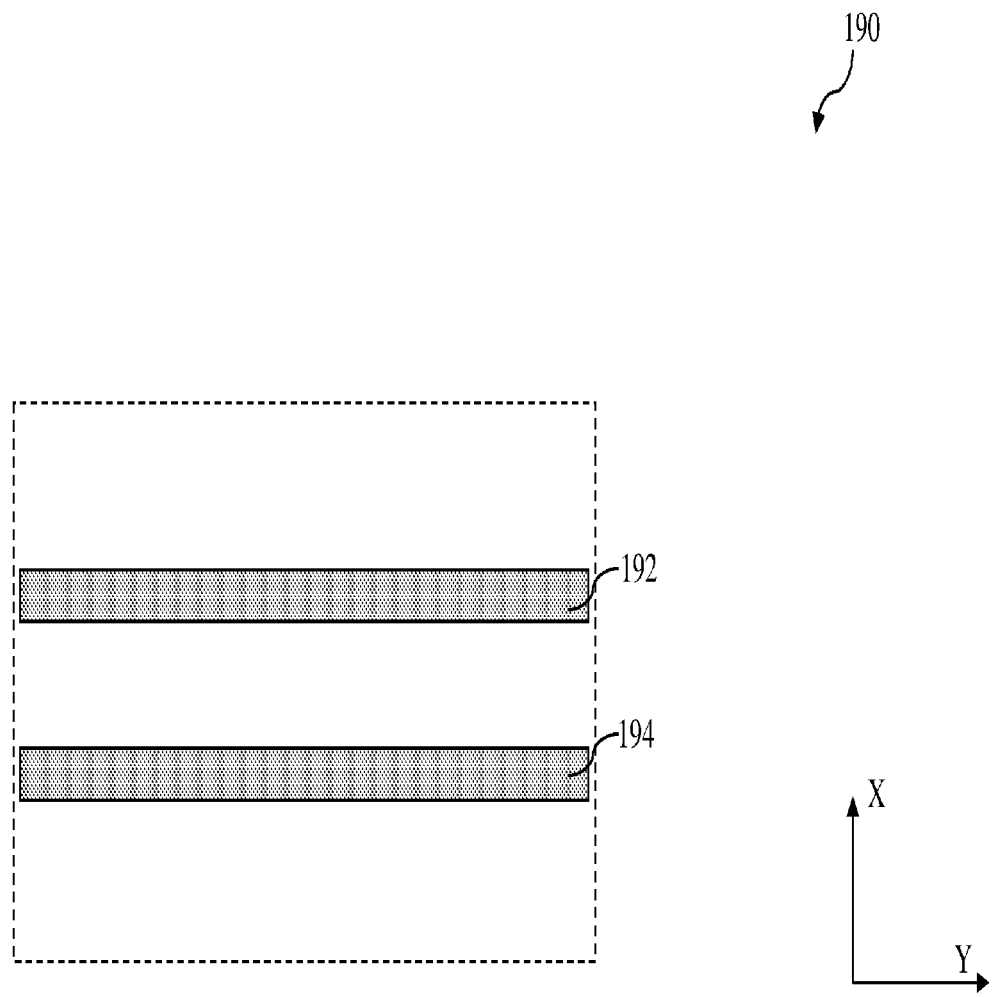

Referring to FIGS. 9 and 18, the method 130 proceeds to step 152 by exposing the second PR layer 190 using a third photomask, such as the third photomask 1162 of FIG. 5 of simple features. The exposed PR layer 190 is illustrated in FIG. 18 as a top view. The exposed PR layer 190 includes unexposed regions 192 and exposed regions 194.

Figure 19:
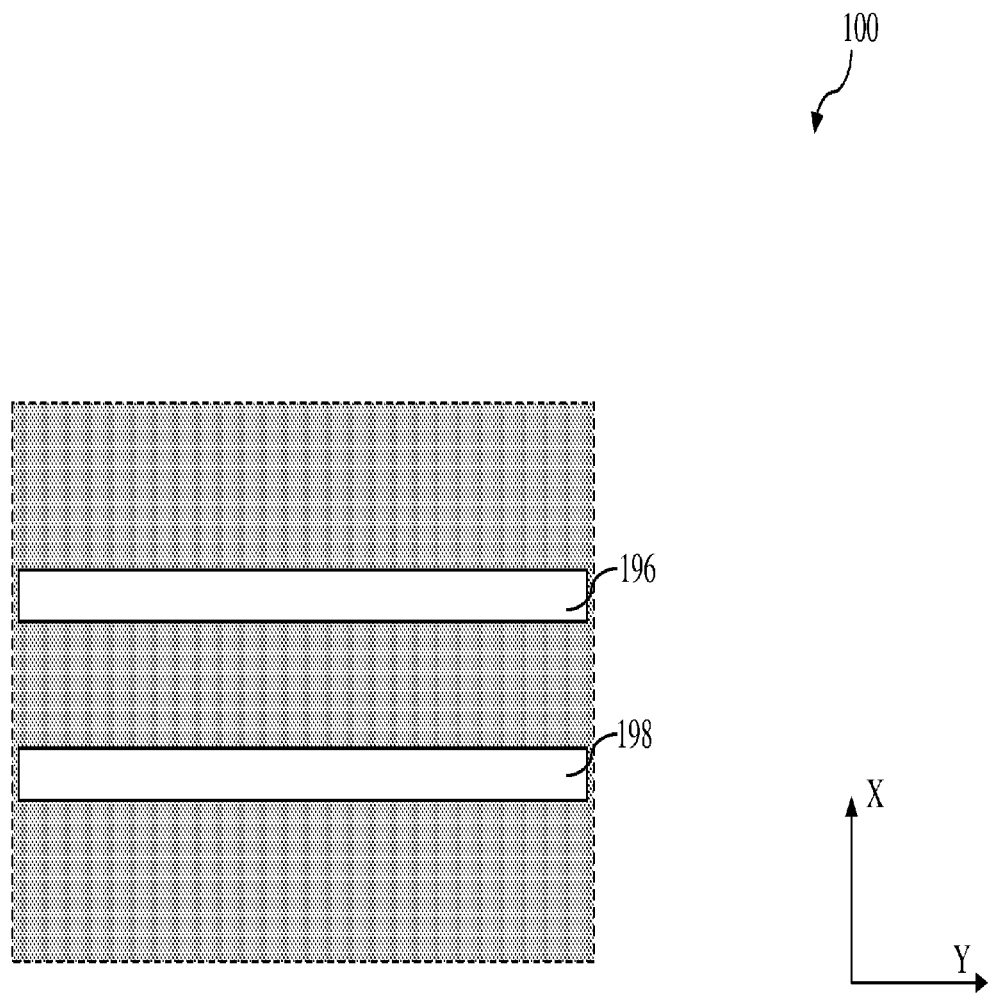
Figure 20:
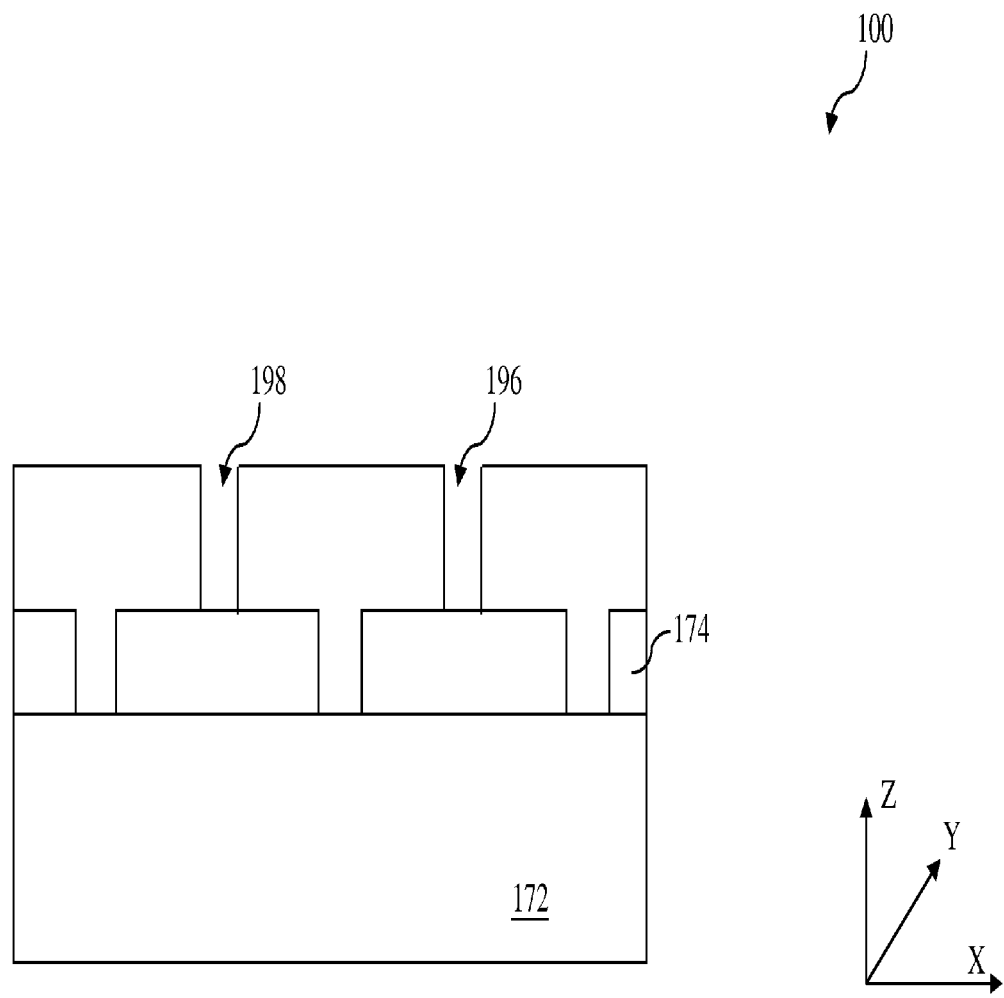

Referring to FIGS. 9, 19 and 20, the method 130 proceeds to step 154 by developing the second PR layer 190, forming the patterned PR layer 190 having a plurality of openings 196 and 198. FIG. 19 illustrates the patterned PR layer 190 in a top view. FIG. 20 illustrates the patterned PR layer 190 in a sectional view. In the present embodiment, a negative developing solution is used such that the PR in the unexposed regions are removed, resulting in a negative image of the exposed pattern.

Figure 21:
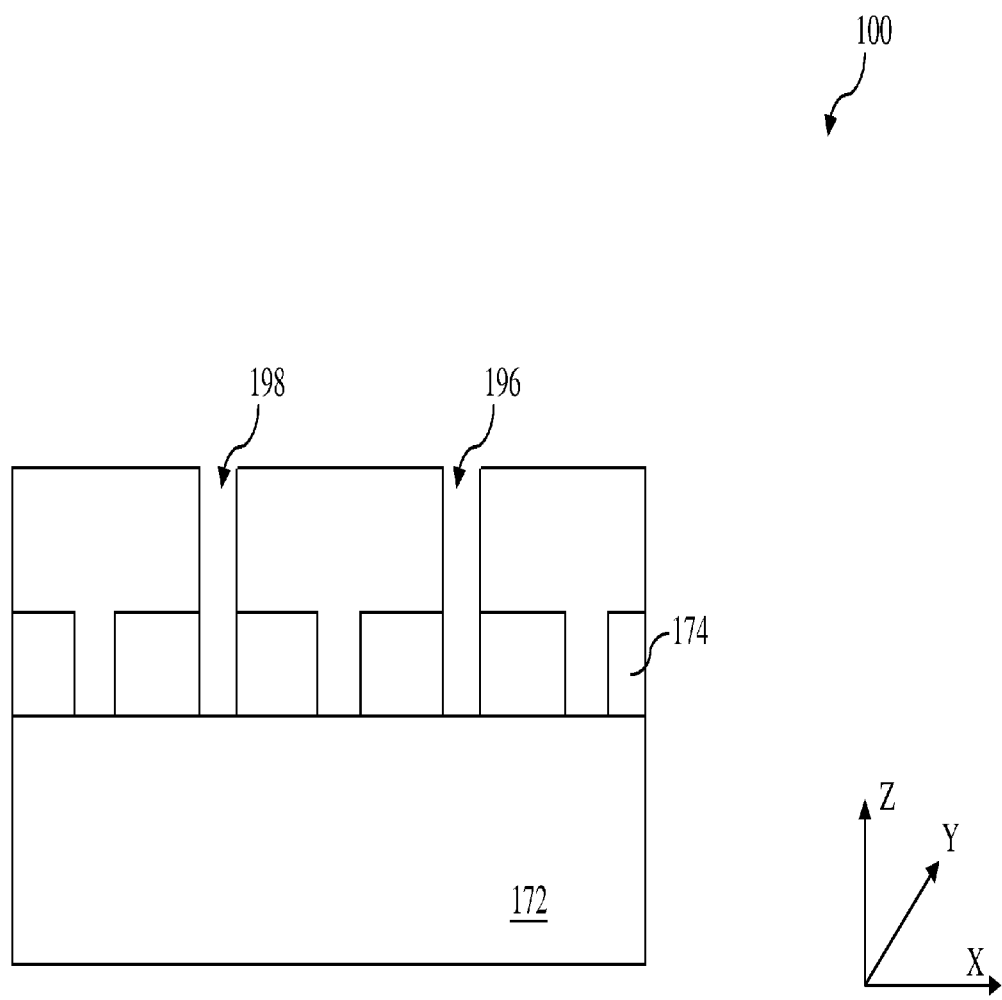

Referring to FIGS. 9 and 21, the method 130 proceeds to step 156 by etching the hard mask layer 174 through the openings of the second PR layer 190. The etching process uses the patterned second PR layer 190 as an etch mask. The etching process may include dry etch, wet etch, a combination thereof or other suitable etch technology.

Figure 22:
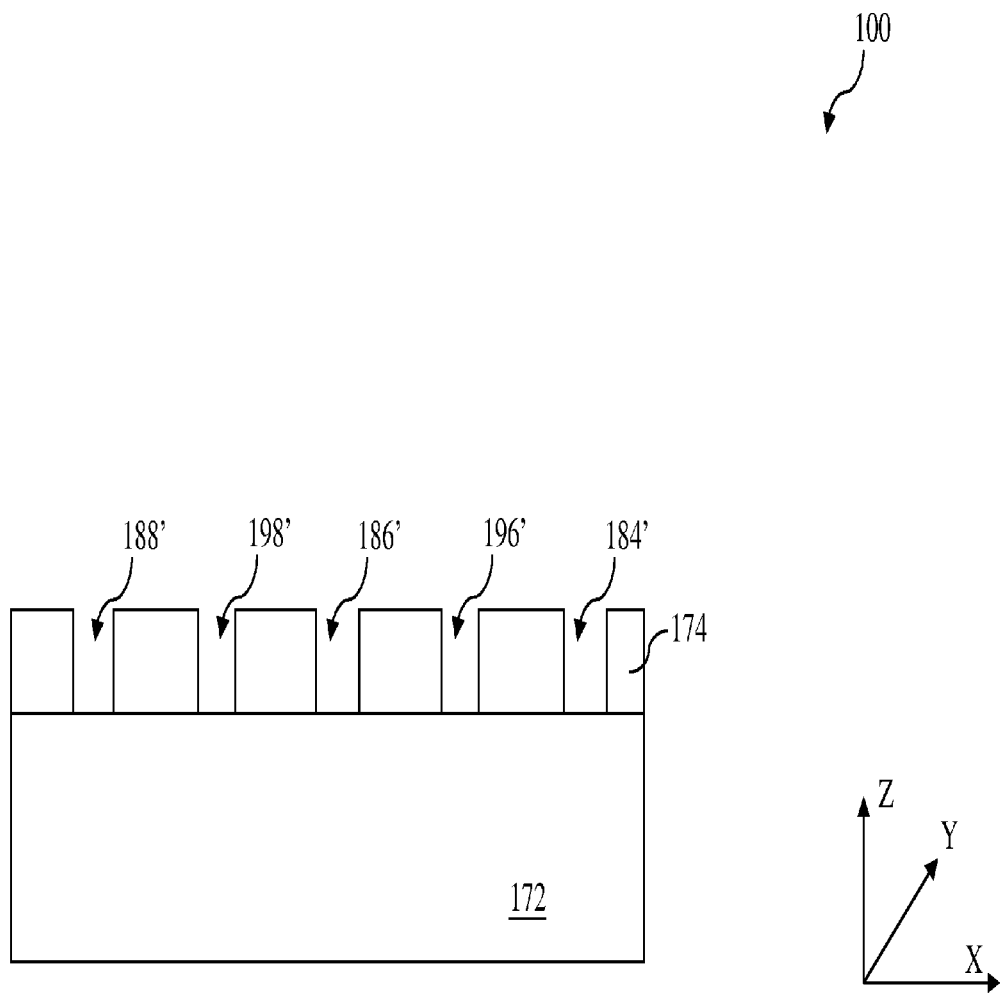
Figure 23:
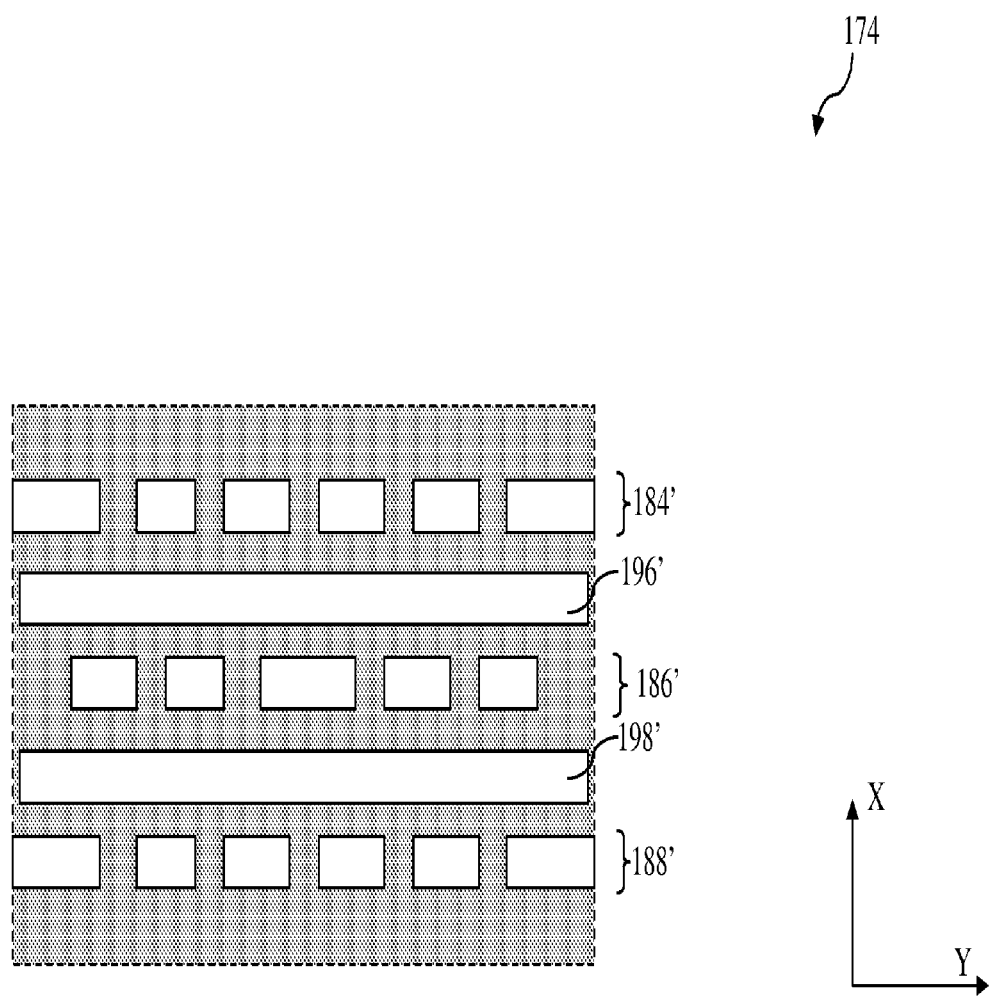

Referring to FIGS. 9, 22 and 23, the method 130 may proceed to step 158 by removing the second PR layer 190 thereafter, by wet stripping or plasma ashing. In the present embodiment, the patterned hard mask layer 174 includes openings 184', 186' and 188' from the first procedure 134 and the openings 196' and 198' from the second procedure 136.

FIG. 22 illustrates the patterned hard mask layer 174 in a sectional view. FIG. 23 illustrates the patterned hard mask layer 174 in a top view. In an alternative embodiment, the first procedure and the second procedure may be implemented in a different order, such as the second procedure and then the first procedure.

Figure 24:
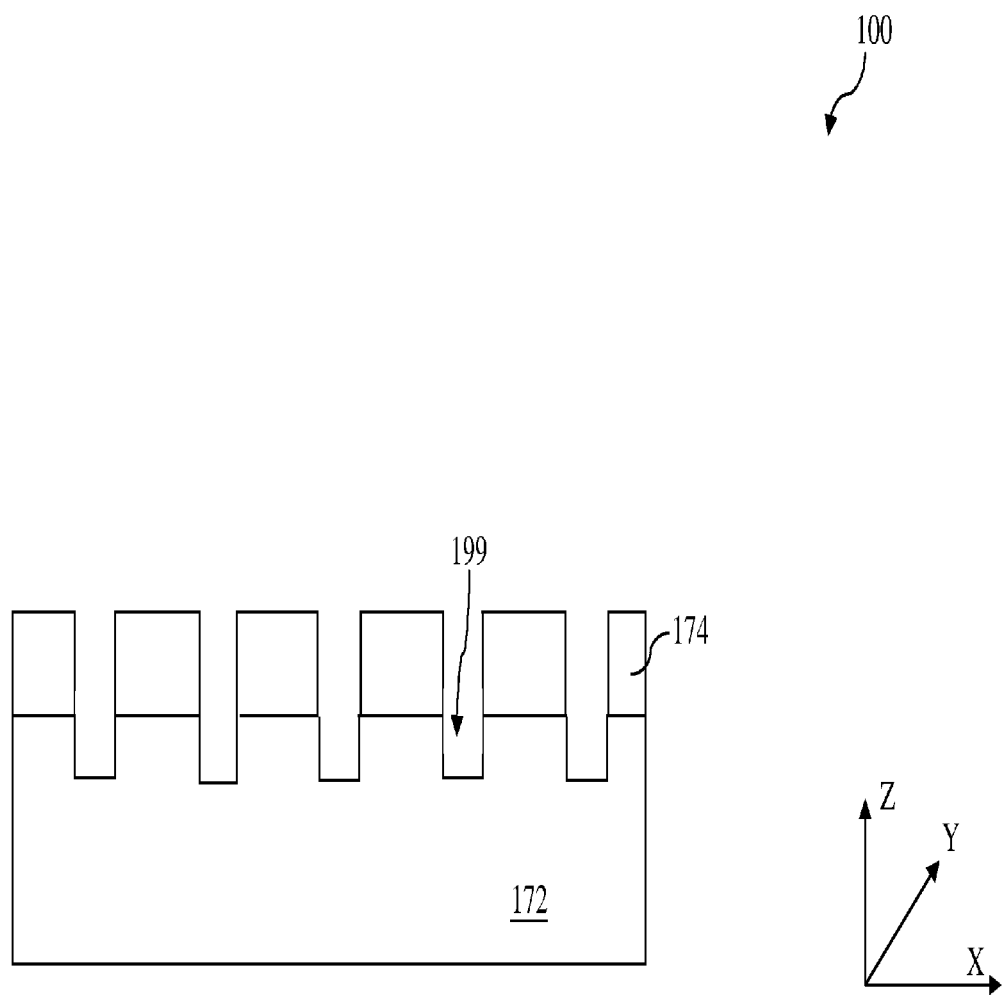
Figure 25:
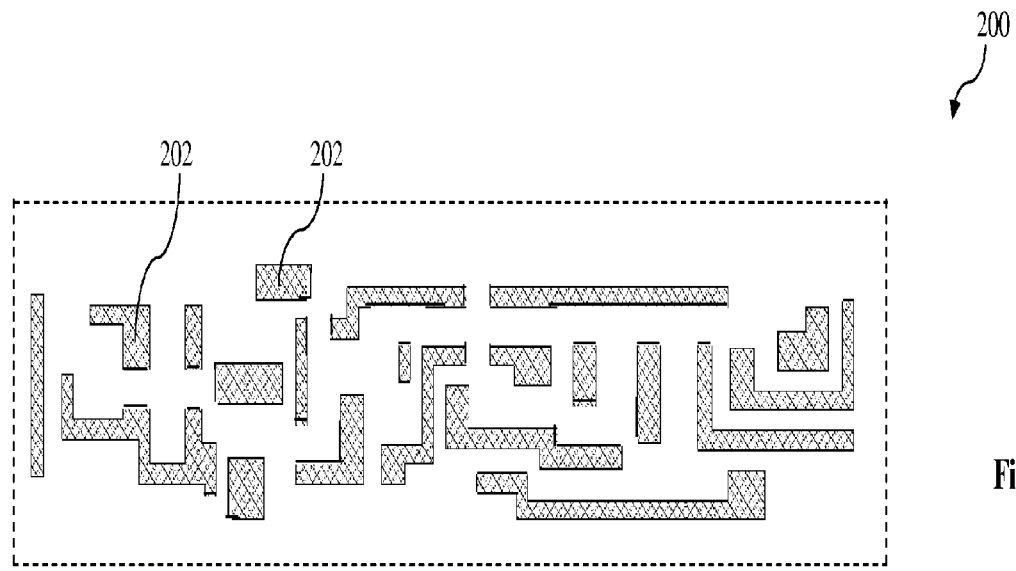
FIGS. 25-28 are schematic views of an IC design layout at various design stages and constructed according to aspects of the present disclosure.

Referring to FIGS. 9 and 24, the method 130 may further include a step 160 by etching the IC substrate 172 through the openings of the hard mask layer 174. In one example, an ILD layer is etched to form trenches 199 therein. The tech process may include dry etch or wet etch designed to selectively etch the material layer underlying the hard mask layer 174. The hard mask layer 174 may be removed afterward.

Other processes may be followed. In the present embodiment, a metal, such as tungsten or copper, is deposited to fill in the trenches in the ILD layer. A polishing process, such as chemical mechanical polishing (CMP), is applied to remove the excessive metal and planarize the surface. Thus, metal lines are formed in the ILD layer.

Figure 26:
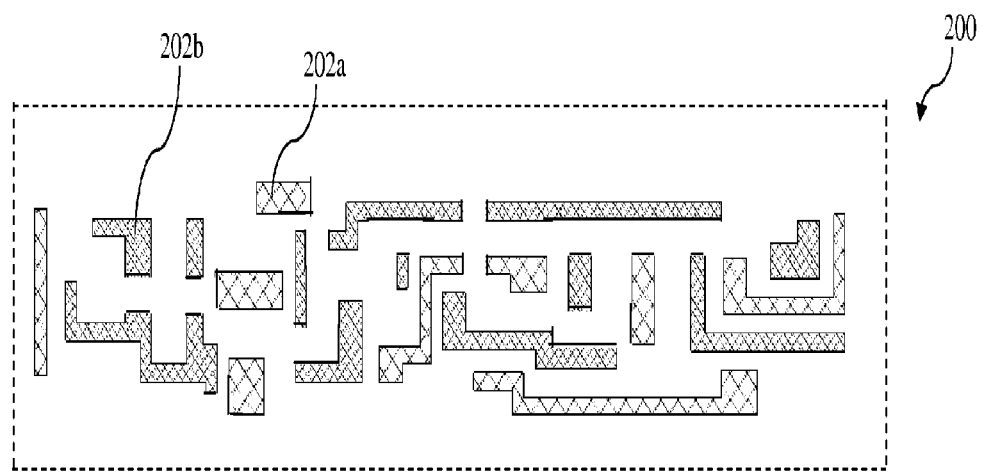

FIGS. 25-28 are schematic views of an IC design layout 200 at various design stages and constructed according to aspects of the present disclosure. The IC design layout 200 provides another example of generating three mask patterns from an IC design layout using the method 50 of FIG. 2. The IC design layout 200 includes a plurality of IC features 202. By first splitting at step 54, the IC features of the IC design layout are split into a first group of simple features 202a and a second group of complex features 202b, as illustrated in FIG. 26. The first group of simple features 202a are used as a mask pattern to generate one photomask.

Figure 27:
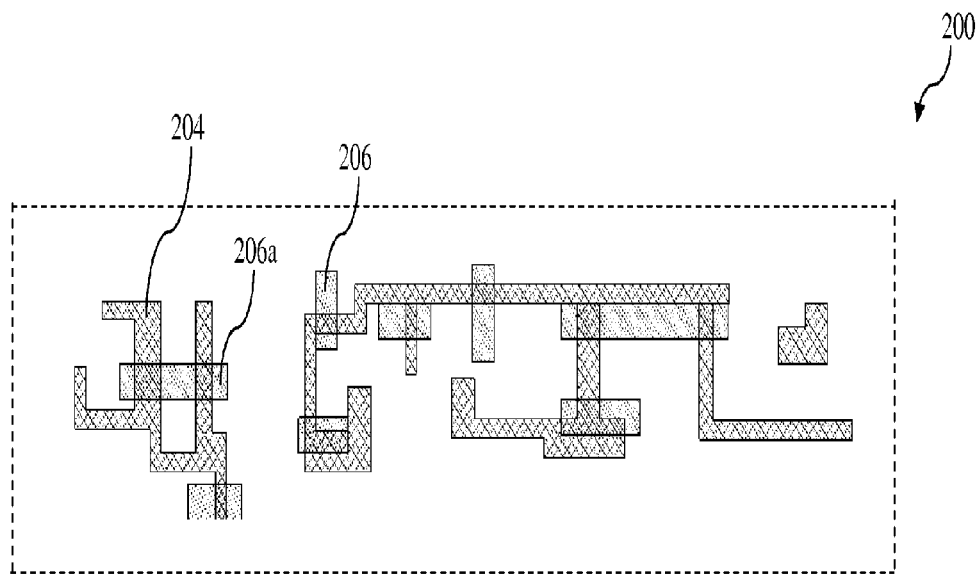

Referring to FIG. 27, the second group of complex features 202b are further processed to generate the third group and the fourth group. Particularly, various connecting features are added to connect the complex features, generating the third group of modified complex features 204 (complex features and connecting features). Accordingly, the fourth group of trimming features 206 is generated by adding trimming features to the fourth group according to the connecting features in the third group. Some trimming features each may correspond to more than one connecting features. For example, the trimming feature 206a corresponds to two connecting features.

Figure 28:
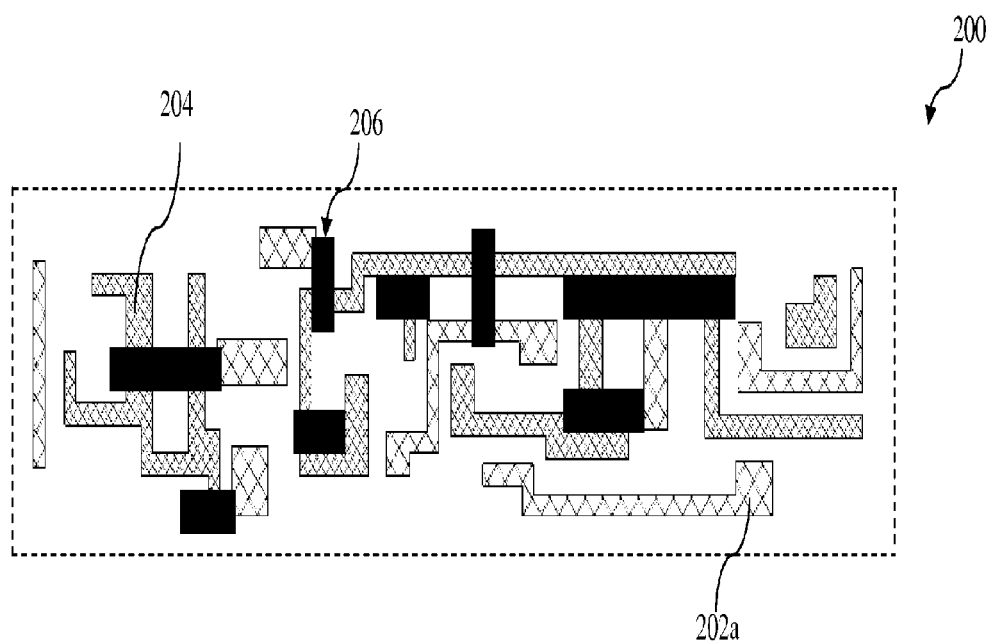

FIG. 28 collectively illustrates the first group of simple features 202a, the third group of modified complex features 204 and the fourth group of trimming features 206. The first group of simple features 202a is used as the third mask pattern, such as illustrated in block 64 of FIG. 2. The third group of modified complex features 204 is used as the first mask pattern, such as illustrated in block 60 of FIG. 2. The fourth group of trimming features 206 is used as the second mask pattern, such as illustrated in block 62 of FIG. 2.

Figure 29:
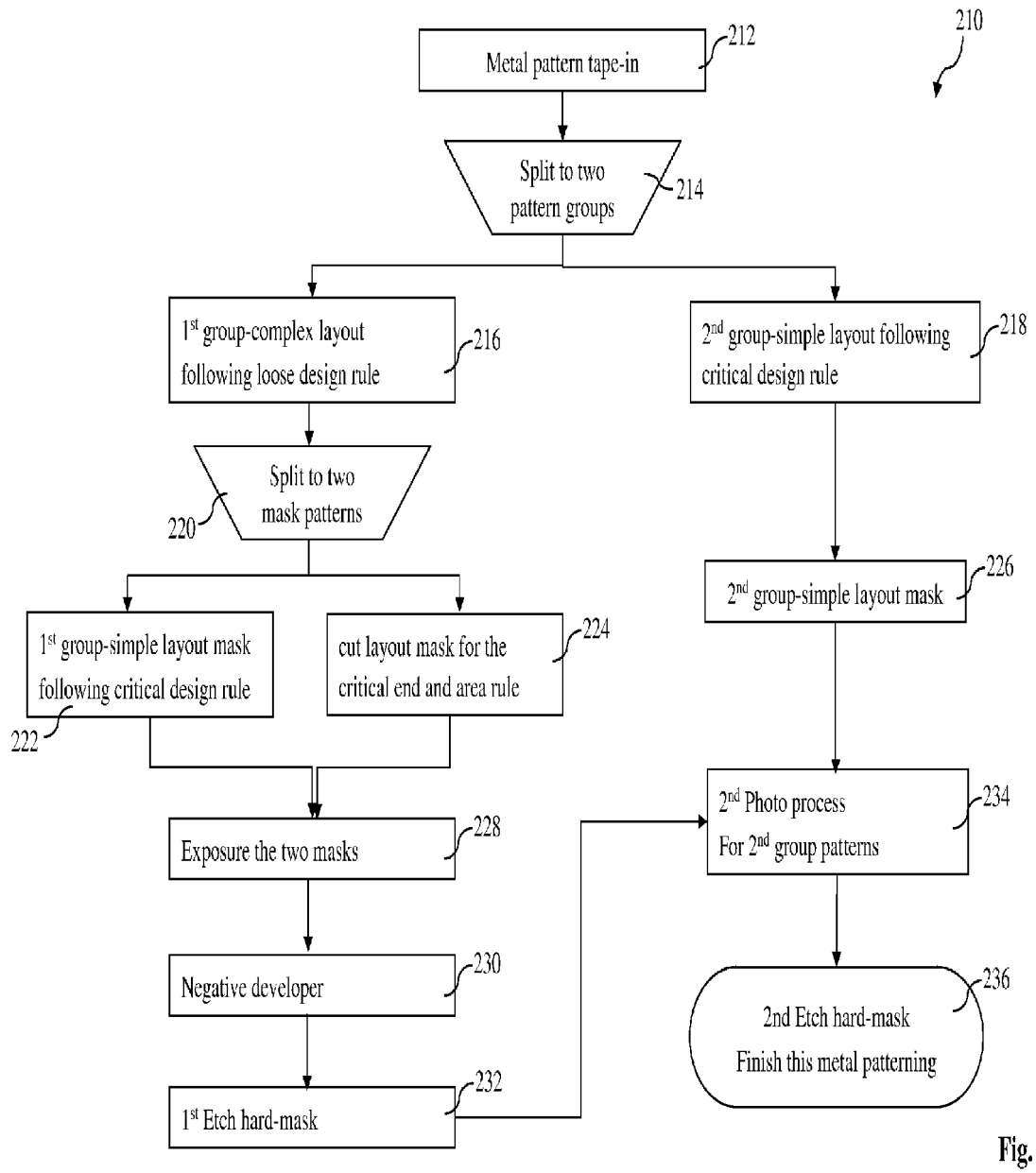
FIG. 29 is a flowchart of an IC method constructed according to aspects of the present disclosure in one or more embodiments.

FIG. 29 is a block diagram of an IC method 210 constructed according to aspects of the present disclosure in one or more embodiments. In the present embodiment, the method 210 is designed for making interconnect features, such as metal lines. The method 210 begins at metal pattern tape-in shown in block 212. The metal pattern defines various features including shape, size and configuration.

The method 210 proceeds to split the metal pattern into two pattern groups as shown at block 214. The first pattern group includes complex features (so the first pattern group is also referred to as complex layout) as shown at block 216. The complex features may violate some design rules, such as feature design rules and the relational design rules. Stated another way, the complex layout follows loose design rules. The second pattern group includes simple features (so the second pattern group is also referred to as simple layout) as shown at block 218. The simple features in the simple layout meet all design rules. Stated another way, the simple layout follows critical design rules.

The complex layout is further split into two mask patterns as shown at block 220. The first mask pattern includes modified complex features that include complex features and connecting features. The modified complex features follow the critical design rules similar to the second group simple layout at block 218. Therefore, the layout of the modified complex features is also referred to the first group simple layout. The first group simple layout is used to form a first group simple layout mask or a first mask, as shown at block 222.

The second mask pattern includes trimming (or cut) features corresponding to the connecting features in the first mask pattern. The cut features are designed for the critical ends (feature design rules) and area rules (relational design rules). The second mask pattern is used to form a cut layout mask or a second mask, as shown at block 224.

The second group simple layout at block 218 is used to form a second group simple layout mask or a third mask as shown at block 226.

The three masks are used to pattern a hard mask layer formed on an IC substrate. At block 228, a first PR layer is coated on the hard mask layer and exposed by the first and second masks sequentially or simultaneously.

Afterward, a negative developer is applied to the exposed first PR layer, resulting in the first PR layer patterned to have a plurality of openings as a combining pattern from the first and second masks.

A first etch process is applied to the hard mask layer at block 232. The first PR layer may be removed after the first etch process.

Then a second PR layer is coated on the hard mask layer. A second photolithography process is applied to the second PR layer, resulting the second PR layer patterned to have a plurality of openings as shown at block 234. The exposure in the second photolithography process is implemented using the third mask.

A second etch process is applied to the hard mask layer at block 236. The second PR layer may be removed after the second etch process.

Thus, the hard mask layer is patterned using the three masks in two exposure and etch procedures. The patterned hard mask layer is used to further pattern the underlying material layer, forming metal features. In one example, a metal layer is deposited underlying the hard mask layer and is patterned to form metal lines by etch using the hard mask layer as an etch mask. In another example, a dielectric material layer is deposited underlying the hard mask layer and is patterned to form trenches by etch using the hard mask layer as an etch mask. Then a metal is deposited to fill in the trenches and a polishing process, such as CMP, is used to remove the excessive metal and planarize the surface.

Other embodiments and modifications may be implemented without departing from the spirit of the present disclosure. In one embodiment, instead of the hard mask layer, a metal layer or a dielectric material layer may be directly patterned to form various IC features using the three masks. In another embodiment, thus patterned hard mask may be used to form various doped features. In yet another embodiment, the disclosed method may be used to form IC features such as shallow trench isolation (STI) features or gate stacks. In yet another embodiment, the photolithography process may utilize other radiation-sensitive material and the corresponding lithography process may use other radiation sources, such as electrons.

Thus, the present disclosure provides an integrated circuit (IC) design method. The method includes receiving an IC design layout having a plurality of IC features; and identifying, from the IC design layout, simple features as a first layout wherein the first layout does not violate design rules; and complex features as a second layout wherein the second layout violates the design rules. The method further includes generating a third layout and a fourth layout from the second layout wherein the third layout includes the complex features and connecting features to meet the design rules and the fourth layout includes trimming features.

In one embodiment, the trimming features are designed to exclude the connecting features from a collective image of the third and fourth layout. In another embodiment, the design rules includes a feature design rule that defines geometrical characteristic an IC feature; and a relational design rule that defines a spatial relationship between two IC features. In yet another embodiment, the feature design rule defines a minimum length of the IC feature; and the relational design rule defines a minimum spacing between the two IC features.

In yet another embodiment, at least a subset of the simple features violates the relational design rule when being configured proximate the complex features in the IC design. In yet another embodiment, the identifying simple features includes determining that a simple feature does not violate the feature design rule and violates the relational design rule between the simple feature and a complex feature. In yet another embodiment, the identifying complex features includes determining that a complex feature violates the feature design rule.

In yet another embodiment, the plurality of IC features are a plurality of line features oriented in a first direction; and the identifying complex features includes determining that a complex feature violates the relational design rule with another complex feature in the first direction.

In another embodiment, the method further includes making a first photomask according to the first layout; making a second photomask according to the third layout; and making a third photomask according to the fourth layout. In yet another embodiment, the method further includes forming the IC features in a material layer using the first, second and third photomasks.

In yet another embodiment, the forming the IC features in a material layer includes patterning a first photoresist layer on the material layer using the first photomask; etching the material layer through openings of the first photoresist layer; removing the first photoresist layer; patterning a second photoresist layer on the material layer using the second and third photomasks; etching the material layer through openings of the second photoresist layer; and removing the second photoresist layer.

In yet another embodiment, the patterning a second photoresist layer includes coating the second photoresist layer on the material layer; exposing the second photoresist layer using the second photomask; exposing the second photoresist layer using the third photomask; and thereafter developing the second photoresist layer. In yet another embodiment, the exposing the second photoresist layer using the second photomask and the exposing the second photoresist layer using the third photomask are implemented in one of sequential exposure mode and simultaneous exposure mode. In yet another embodiment, the material layer is a hard mask layer on an underlying material layer and the method further includes etching the underlying material layer through openings of the hard mask layer after the etching the material layer through openings of the first photoresist layer and the etching the material layer through openings of the second photoresist layer.

The present disclosure also provide an embodiment of method for making an integrated circuit. The method includes forming a material layer on a substrate; patterning a first photoresist layer on the material layer using a first photomask; etching the material layer through openings of the first photoresist layer; removing the first photoresist layer; patterning a second photoresist layer on the material layer using a second photomask and a third photomask; etching the material layer through openings of the second photoresist layer; and removing the second photoresist layer.

In one embodiment, the patterning a second photoresist layer includes coating the second photoresist layer on the material layer; performing a first exposing process to the second photoresist layer using the second photomask; performing a second exposing process to the second photoresist layer using the third photomask; and thereafter developing the second photoresist layer.

In another embodiment, the exposing the second photoresist layer using the second photomask and the exposing the second photoresist layer using the third photomask are performed sequentially. In yet another embodiment, the exposing the second photoresist layer using the second photomask and the exposing the second photoresist layer using the third photomask are performed simultaneously.

In yet another embodiment, the material layer is a hard mask layer and the method further includes etching the substrate through openings of the hard mask layer after the etching the material layer through openings of the first photoresist layer and the etching the material layer through openings of the second photoresist layer.

In yet another embodiment, the first, second and third photomasks are designed according to an IC design layout having a plurality of IC features to be formed on the substrate. In yet another embodiment, the first photomask includes a first layout having a first subset of the IC features, wherein the first layout does not violate design rules; the second photomask includes a second layout having a second subset of the IC features and connecting features, wherein the second subset of the IC features violate the design rules and the second layout does not violate the design rules; and the third photomask includes a third layout having a plurality of trimming features correspond to the connecting features.

The present disclosure also provides a set of photomasks designed to form integrated circuit (IC) features in a material layer. The set of photomasks includes a first photomask that includes a first layout having a first subset of the IC features, wherein the first layout does not violate design rules; a second photomask that includes a second layout having a second subset of the IC features and connecting features, wherein the second subset of the IC features violate the design rules and the second layout does not violate the design rules; and a third photomask that includes a third layout having a plurality of trimming features that match the connecting features.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit (IC) design method comprising:
   receiving an IC design layout having a plurality of IC features;
   identifying, from the IC design layout, at least one of first IC features violating at least one of a plurality of design rules; and
   generating a modified IC design layout based on the identified IC feature, wherein the modified IC design layout includes a first modified IC feature for generating a first photomask and a second modified IC feature for generating a second photomask.

2. The method of claim 1, wherein the first modified IC feature includes a connecting feature, and the second modified IC feature includes a trimming feature.

3. The method of claim 1, wherein the design rules include:
   a feature design rule for defining a minimum length of the IC feature; and
   a relational design rule for defining a minimum spacing between at least two IC features.

4. The method of claim 3, wherein the method further includes:
   identifying, from the IC design layout, a second IC feature not violating at least one of the design rules.

5. The method of claim 4, wherein the identified second IC feature violates the relational design rule that the identified second IC feature separates from the identified first IC feature by a space smaller than the defined minimum spacing.

6. The method of claim 4, wherein the identified second IC feature is for generating a third photomask.

7. The method of claim 6, further comprising
   making a first photomask according to the first modified IC feature;
   making a second photomask according to the second modified IC feature; and
   making a third photomask according to the identified second IC feature.

8. The method of claim 7, further comprising forming the IC features in a material layer using the first, second, and third photomasks.

9. The method of claim 3, wherein the plurality of IC features includes a plurality of line features oriented in a first direction and the identified at least one first IC features violates the relational design rule with another first IC feature in the first direction.

10. A method for making an integrated circuit (IC), comprising:
    forming a material layer on a substrate;
    patterning a first photoresist layer on the material layer using a first photomask;
    etching the material layer through openings of the first photoresist layer;
    removing the first photoresist layer;
    patterning a second photoresist layer on the material layer using a second photomask and a third photomask;
    etching the material layer through openings of the second photoresist layer; and
    removing the second photoresist layer,
    wherein the first photomask defines a first IC layout having at least one IC feature not violating at least one of a plurality of design rules,
    wherein the second photomask defines a first modified IC layout and the third photomask defines a second modified IC layout, the first and the second modified IC layouts are generated by modifying a second IC layout violating at least one of the design rules.

11. The method of claim 10, wherein the patterning a second photoresist layer includes:
coating the second photoresist layer on the material layer;
performing a first exposing process to the second photoresist layer using the second photomask;
performing a second exposing process to the second photoresist layer using the third photomask; and
thereafter, developing the second photoresist layer.

12. The method of claim 11, wherein the exposing the second photoresist layer using the second photomask and the exposing the second photoresist layer using the third photomask are performed sequentially.

13. The method of claim 12, wherein the exposing the second photoresist layer using the second photomask and the exposing the second photoresist layer using the third photomask are performed simultaneously.

14. The method of claim 11, wherein the material layer is a hard mask layer and the method further includes etching the substrate through openings of the hard mask layer after the etching the material layer through openings of the first photoresist layer and the etching the material layer through openings of the second photoresist layer.

15. The method of claim 10, wherein the first, second, and third photomasks are designed according to an IC design layout having a plurality of IC features to be formed on the substrate.

16. The method of claim 10, wherein the first modified IC layout includes a connecting feature, and the second modified IC layout includes a trimming feature.

17. The method of claim 10, wherein the design rules include:
a feature design rule for defining a minimum length of the IC feature; and
a relational design rule for defining a minimum spacing between at least two IC features.

18. The method of claim 17, wherein the first IC layout violates the relational design rule that the first IC layout separates from the second IC layout by a space smaller than the defined minimum spacing.

19. The method of claim 10, further comprising
making a first photomask according to the first IC layout;
making a second photomask according to the first modified IC layout; and
making a third photomask according to the second modified IC layout.

* * * * *